United States Patent
Kang

(10) Patent No.: US 9,449,830 B2
(45) Date of Patent: Sep. 20, 2016

(54) TRANSISTOR HAVING TUNGSTEN-BASED BURIED GATE STRUCTURE, METHOD FOR FABRICATING THE SAME

(71) Applicant: SK hynix Inc., Gyeonggi-do (KR)

(72) Inventor: Dong-Kyun Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 76 days.

(21) Appl. No.: 14/326,205

(22) Filed: Jul. 8, 2014

(65) Prior Publication Data

US 2015/0228491 A1 Aug. 13, 2015

(30) Foreign Application Priority Data

Feb. 7, 2014 (KR) ........................ 10-2014-0014094

(51) Int. Cl.
| | |
|---|---|
| *H01L 21/3205* | (2006.01) |
| *H01L 21/4763* | (2006.01) |
| *H01L 21/28* | (2006.01) |
| *H01L 29/423* | (2006.01) |
| *H01L 29/49* | (2006.01) |
| *H01L 29/66* | (2006.01) |
| *H01L 45/00* | (2006.01) |
| *H01L 27/22* | (2006.01) |
| *H01L 27/24* | (2006.01) |
| *H01L 27/108* | (2006.01) |
| *H01L 29/78* | (2006.01) |

(52) U.S. Cl.
CPC ... *H01L 21/28194* (2013.01); *H01L 21/28079* (2013.01); *H01L 21/28202* (2013.01); *H01L 27/10823* (2013.01); *H01L 27/10876* (2013.01); *H01L 27/228* (2013.01); *H01L 27/2436* (2013.01); *H01L 27/2463* (2013.01); *H01L 29/4236* (2013.01); *H01L 29/4958* (2013.01); *H01L 29/66621* (2013.01); *H01L 29/78* (2013.01); *H01L 45/04* (2013.01); *H01L 45/06* (2013.01); *H01L 45/145* (2013.01); *H01L 45/16* (2013.01)

(58) Field of Classification Search
CPC .................. H01L 21/28079; H01L 21/28194; H01L 21/28185; H01L 21/28202; H01L 21/76814; H01L 21/76841
USPC ........................................ 438/270, 589, 259
See application file for complete search history.

(56) References Cited

U.S. PATENT DOCUMENTS

| | | | |
|---|---|---|---|
| 6,905,543 B1 | 6/2005 | Fair et al. | |
| 8,207,062 B2 | 6/2012 | Gao et al. | |
| 2005/0221000 A1 | 10/2005 | Ikeda et al. | |
| 2010/0240180 A1* | 9/2010 | Jeon | H01L 21/82343 438/239 |

* cited by examiner

*Primary Examiner* — Thien F Tran
(74) *Attorney, Agent, or Firm* — I P & T Group LLP

(57) ABSTRACT

A method for fabricating a transistor that includes forming a trench in a substrate, forming a gate dielectric layer on a surface of the trench, forming a first fluorine-free tungsten layer as an interface stabilization layer over the gate dielectric layer, forming a second fluorine-free tungsten layer as a barrier layer over the first fluorine-free tungsten layer, forming a bulk tungsten layer as a gate electrode over the second tungsten layer to fill the trench, and selectively recessing the third tungsten layer, the second tungsten layer and the first tungsten layer to form a buried gate structure.

16 Claims, 20 Drawing Sheets

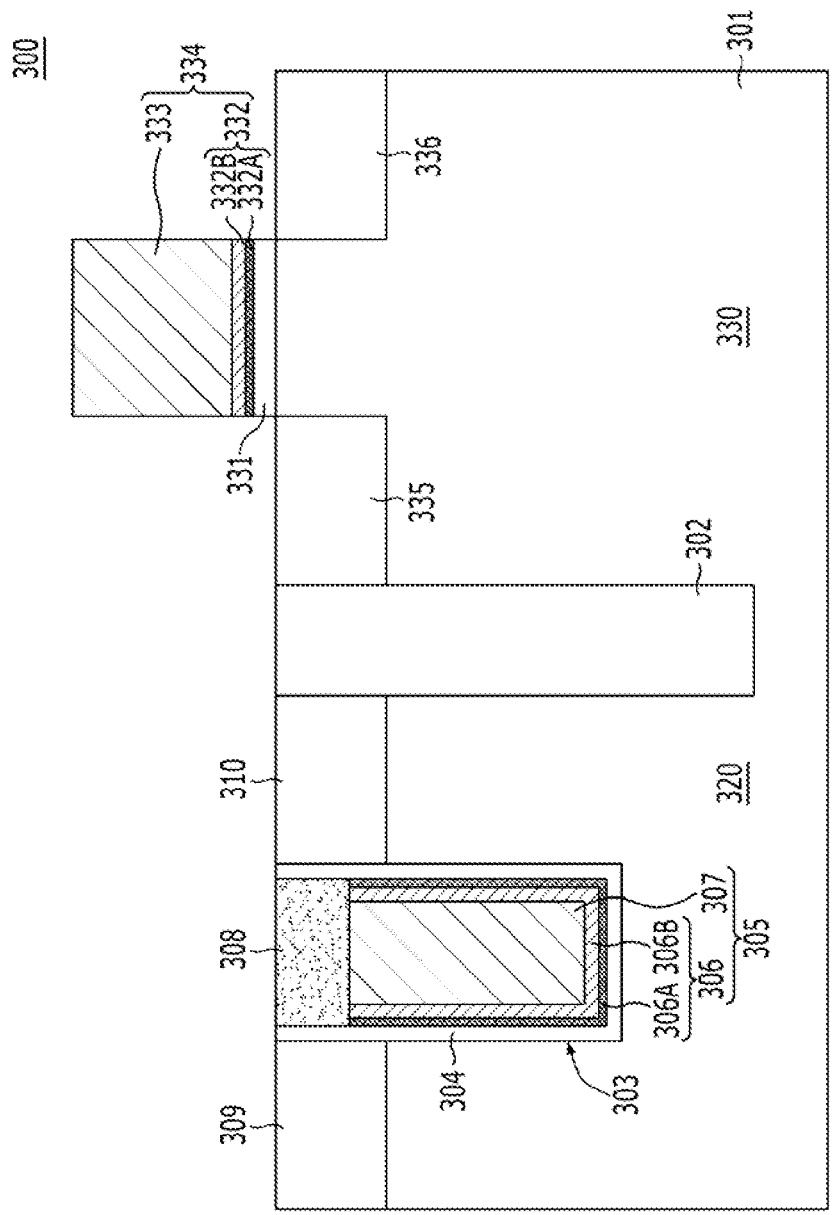

TRANSISTOR HAVING TUNGSTEN-BASED BURIED GATE STRUCTURE, METHOD FOR FABRICATING THE SAME

CROSS-REFERENCE TO RELATED APPLICATIONS

The present application claims priority of Korean Patent Application No. 10-2014-0014094, filed on Feb. 7, 2014, which is incorporated herein by reference in its entirety.

BACKGROUND

1. Field

Exemplary embodiments of the present invention relate to a transistor and, more particularly, to a transistor having a tungsten-based buried gate structure and a method for fabricating the same.

2. Description of the Related Art

A metal gate electrode may be used for the gate electrode of a transistor. The gate resistance may be reduced by the metal gate electrode. Additionally, the channel dose may be reduced since the metal gate electrode has a high work function. Therefore, the performance of the transistor may be improved by reducing the amount of leakage current.

The metal gate electrode includes a barrier layer for protecting the gate dielectric layer from being attacked. A metal nitride, such as a titanium nitride (TiN), is generally used for the barrier layer.

However, since the metal nitride has high resistivity, there is a limitation in reducing the gate resistance of the metal gate electrode.

SUMMARY

Exemplary embodiments of the present invention are directed to a transistor having a low resistance buried gate structure capable of protecting a gate dielectric layer from being attacked during the deposition process, and a method for fabricating the transistor.

In accordance with an embodiment of the present invention, a method for fabricating a transistor includes forming a trench in a substrate, forming a gate dielectric layer on a surface of the trench, forming a first fluorine-free tungsten layer as an interface stabilization layer over the gate dielectric layer, forming a second fluorine-free tungsten layer as a barrier layer over the first fluorine-free tungsten layer, forming a bulk tungsten layer as a gate electrode over the second tungsten layer to fill the trench, and selectively recessing the third tungsten layer, the second tungsten layer and the first tungsten layer to form a buried gate structure.

In accordance with another embodiment of the present invention, a method for fabricating a transistor includes forming a trench in a substrate, forming a gate dielectric layer on a surface of the trench, performing a plasma nitridation process on the gate dielectric layer, forming a first fluorine-free tungsten layer over the gate dielectric layer through a pre-treatment, forming a second fluorine-free tungsten layer over the first fluorine-free tungsten layer, performing a post-treatment of the first and second fluorine-free tungsten layers, forming a bulk tungsten layer over the second tungsten layer to fill the trench, annealing the bulk tungsten layer, and selectively recessing the bulk tungsten layer, the second fluorine-free tungsten layer and the first fluorine-free tungsten layer to form a buried gate structure.

In accordance with another embodiment of the present invention, a transistor includes a trench formed in a substrate, a source region and a drain region, which are spaced apart by the trench, a gate dielectric layer formed on the bottom and on the sidewalls of the trench, a fluorine-free tungsten interface stabilization layer formed over the gate dielectric layer, a fluorine-free tungsten barrier layer formed over the fluorine-free tungsten interface stabilization layer, and a bulk tungsten buried gate electrode filling the trench over the fluorine-free tungsten barrier layer.

BRIEF DESCRIPTION OF THE DRAWINGS

FIG. 14 is a cross-sectional view illustrating a semiconductor device including the transistor in accordance with the embodiments of the present invention.

DETAILED DESCRIPTION

Figure 1:
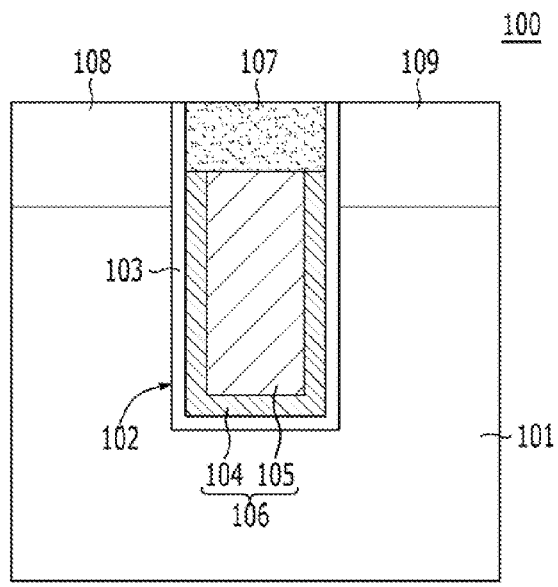
FIG. 1 is a cross-sectional view illustrating a buried gate structure in accordance with a first embodiment of the present invention.

Various examples and implementations of the disclosed technology are described below in detail with reference to the accompanying drawings.

The drawings may not necessarily be to scale and, in some instances, proportions of structures in the drawings may have been exaggerated to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Also, it is noted that in this specification, "connected/coupled" refers to one component not only directly coupling another component but also indirectly coupling another component through an intermediate component. In addition, the singular form may include the plural form, and vice versa, as long as it is not specifically mentioned.

Figure 2:
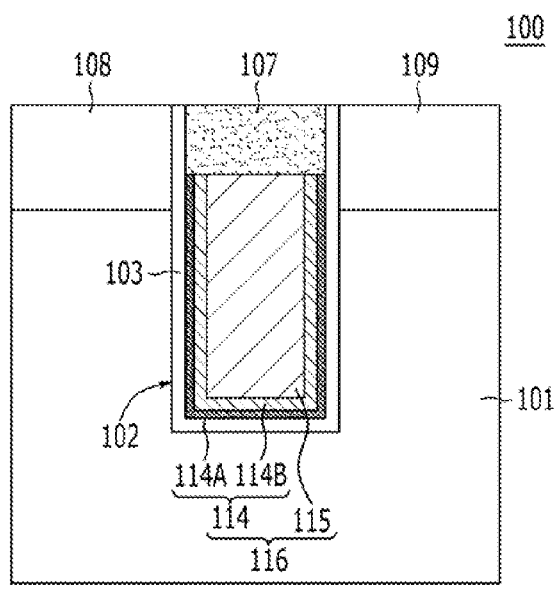
FIG. 2 is a cross-sectional view illustrating a buried gate structure in accordance with a second embodiment of the present invention.

FIG. 1 is a cross-sectional view illustrating a buried gate structure in accordance with a first embodiment of the present invention. FIG. 2 is a cross-sectional view illustrating a buried gate structure in accordance with a second embodiment of the present invention.

Referring to FIGS. 1 and 2, a trench 102 is formed with a predetermined depth in a substrate 101. The substrate 101 may include a semiconductor substrate. The substrate 101 may be a silicon substrate. The trench 102 is extended in a direction and may have a high aspect ratio.

A gate dielectric layer 103 is formed at the bottom and on the sidewalls of the trench 102. The gate dielectric layer 103 may include at least one among a silicon oxide, a silicon nitride, a silicon oxynitride and a high-k material. The high-k material may have a dielectric constant higher than the silicon oxide and the silicon nitride. The gate dielectric layer 103 may have a surface on which a plasma nitridation process is performed.

A buried gate structure 106 is formed in the trench 102. The buried gate structure 106 includes a first tungsten layer 104 and a second tungsten layer 105. The first tungsten layer 104 becomes a barrier layer, and the second tungsten layer 105 becomes a gate electrode. The first tungsten layer 104 protects a lower region, e.g., the gate dielectric layer 103 and the bottom and the sidewalls of the trench 102 from being attacked during the deposition process of the second tungsten layer 105. Additionally, the first tungsten layer 104 improves interlayer adhesion between the gate dielectric layer 103 and the second tungsten layer 105. The first tungsten layer 104 is thin and the second tungsten layer 105 fills the trench 102. The first tungsten layer 104 may include a fluorine-free tungsten (W) layer (FFW). The first tungsten layer 104 may be referred to as a fluorine-free tungsten barrier layer. As the first tungsten layer 104 is formed by using the fluorine-free tungsten layer, the gate dielectric layer 103 is protected from being attacked by fluorine. The second tungsten layer 105 may include a fluorine-free tungsten layer or a fluorine-containing tungsten layer. Although the second tungsten layer 105 contains fluorine, the fluorine attack of the gate dielectric layer 103 is prevented by the first tungsten layer 104. De-lamination between the buried gate structure 106 and the gate dielectric layer 103 is prevented by the first tungsten layer 104. The first tungsten layer 104 may be formed through an atomic layer deposition (ALD) process, and the second tungsten layer 105 fills the trench 102 without voids through a chemical vapor deposition (CVD) process. The ALD process for forming the first tungsten layer 104 may be performed with low-power high-frequency plasma.

The second tungsten layer 105 includes low-resistivity bulk tungsten. The low-resistivity bulk tungsten has large crystal grains. After a bulk tungsten deposition process is performed, an annealing process is performed, and thus the low-resistivity bulk tungsten having large crystal grains may be formed. Additionally, the low-resistivity bulk tungsten may be deposited to have large crystal grains during the deposition process.

The upper portion of the buried gate structure 106 is recessed to have a height lower than the upper surface of the substrate 101. Therefore, a recessed gap area is formed in the trench 102. The recessed gap area is filled with a capping layer 107. The capping layer includes an insulation material. The capping layer 107 may include a silicon oxide, a silicon nitride or a silicon oxynitride. The capping layer 107 protects the buried gate structure 106 from the subsequent processes.

A first impurity region 108 and a second impurity region 109 are formed through a doping process, such as an ion-implantation process, a plasma doping process, etc. The first and second impurity regions 108 and 109 are doped with an N-type impurity or a P-type impurity. The first impurity region 108 and the second impurity region 109 may be referred to as a source region and a drain region, respectively. A semiconductor device 100 including the buried gate structure 106 and the first and second impurity regions 108 and 109 may be a transistor.

Referring to FIG. 2, a buried gate structure 116 includes a first tungsten layer 114A, a second tungsten layer 114B and a third tungsten layer 115. The first tungsten layer 114A and the second tungsten layer 114B become a fluorine-free tungsten barrier layer 114. The third tungsten layer 115 becomes a gate electrode.

The fluorine-free tungsten barrier layer 114 may be a bi-layer. The first tungsten layer 114A and the second tungsten layer 114B are fluorine-free tungsten layers. As the first tungsten layer 114A and the second tungsten layer 114B are formed by using the fluorine-free tungsten layer, the gate dielectric layer 103 is protected from being attacked by fluorine. The third tungsten layer 115 may include a fluorine-free tungsten layer or a fluorine-containing tungsten layer. Although the third tungsten layer 115 contains fluorine, fluorine attack of the gate dielectric layer 103 is prevented by the first and second tungsten layers 114A and 114B. The first tungsten layer 114A may be thinner than the second tungsten layer 114B. The interface between the fluorine-free tungsten barrier layer 114 and the gate dielectric layer 103 is stabilized due to the first tungsten layer 114A. That is, de-lamination between the fluorine-free tungsten barrier layer 114 and the gate dielectric layer 103 is effectively prevented. The first tungsten layer 114A and the second tungsten layer 114B are thinly formed through an ALD process and the third tungsten layer 115 fills the trench 102 without a void, through a CVD process. The third tungsten layer 115 includes a low resistance bulk tungsten layer. The ALD process for forming the first tungsten layer 114A and the second tungsten layer 114B may be performed with low-power high-frequency plasma. The first tungsten layer 114A may be deposited with a high-frequency plasma with power that is less than that used in the second tungsten layer 114B.

According to FIGS. 1 and 2, the buried gate structures 106 and 116 may be low-resistivity tungsten-based buried gate electrodes. The buried gate structures 106 and 116 do not include a metal nitride such as a titanium nitride (TiN). The titanium nitride has a large resistivity, and de-lamination occurs on an interface with the gate dielectric layer 103. In embodiments of the present invention, a low-resistivity tungsten-based buried gate electrodes may be formed without de-lamination by forming a barrier layer using a fluorine-free tungsten layer.

The buried gate structures 106 and 116 shown in FIGS. 1 and 2 may be formed in accordance with various embodiments of the present invention.

Figure 3:
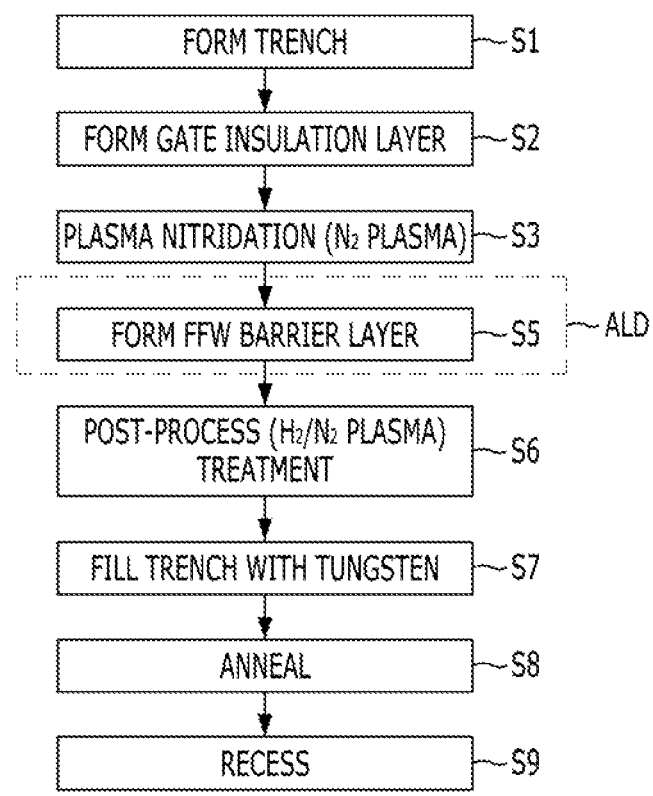
FIGS. 3 to 5 are flowcharts illustrating a method for forming a buried gate electrode in accordance with the embodiments of the present invention.
Figure 4:
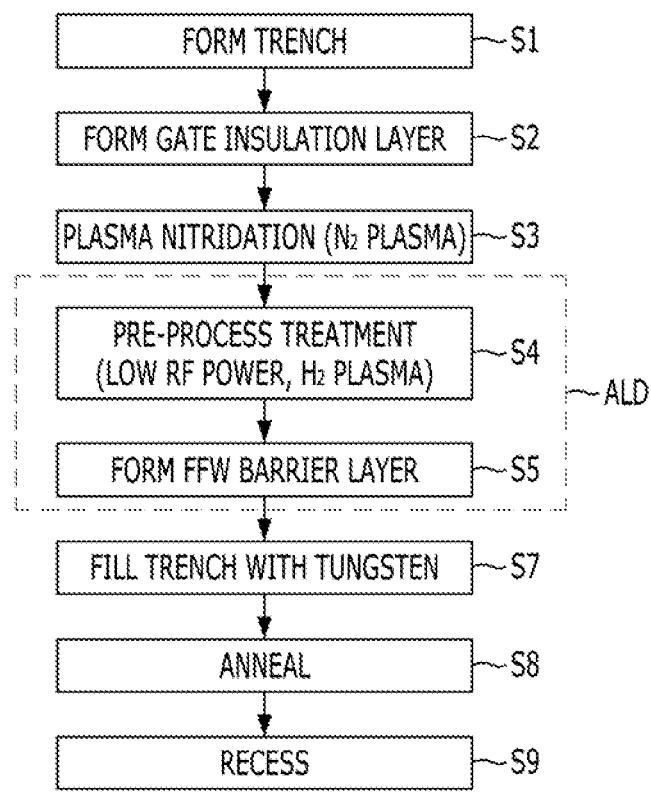
Figure 5:
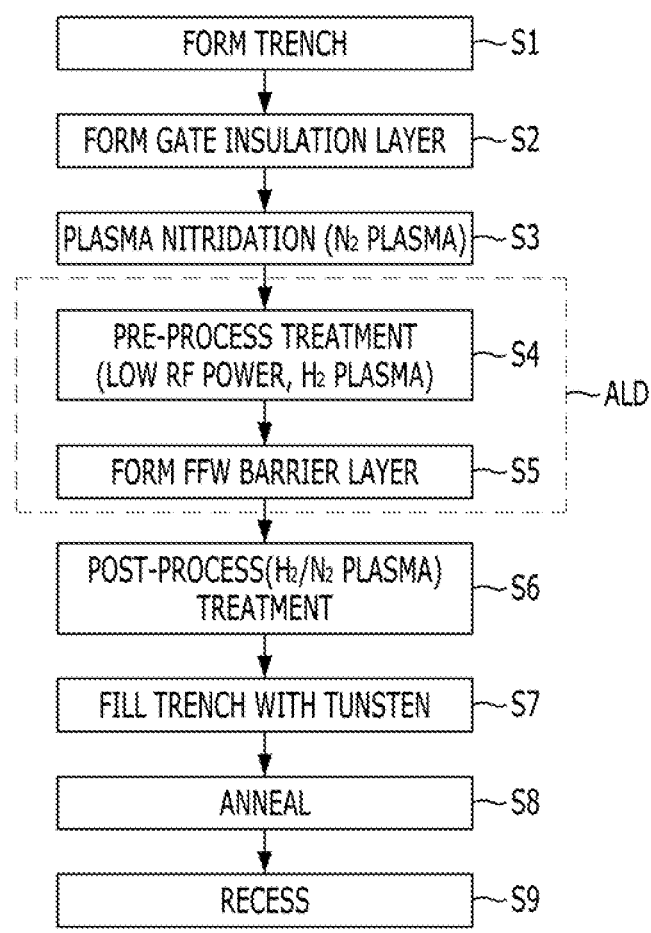

FIGS. 3 to 5 are flowcharts illustrating a method for forming a buried gate structure in accordance with the embodiments of the present invention.

Referring to FIG. 3, a first method includes forming a trench in step S1, forming a gate dielectric layer in step S2, performing a plasma nitridation process in step S3, forming a fluorine-free tungsten barrier layer in step S5, performing a post-treatment in step S6, filling the trench with a bulk tungsten layer in step S7, performing an annealing process in step S8, and performing a recessing process in step S9.

Referring to FIG. 4, a second method includes forming a trench in step S1, forming a gate dielectric layer in step S2, performing a plasma nitridation process in step S3, performing a pre-treatment in step S4, forming a fluorine-free tungsten barrier layer in step S5, filling the trench with a bulk tungsten layer in step S7, performing an annealing process in step S8, and performing a recessing process in step S9.

Referring to FIG. 5, a third method includes forming a trench in step S1, forming a gate dielectric layer in step S2, performing a plasma nitridation process in step S3, performing a pre-treatment in step S4, forming a fluorine-free tungsten barrier layer in step S5, performing a post-treatment in step S6, filling the trench with a bulk tungsten layer in step S7, performing an annealing process in step S8, and performing a recessing process in step S9.

In the first method, the post-treatment of step S6 is performed after the fluorine-free tungsten barrier layer is formed in step S5. In the second method, the pre-treatment of step S4 is performed before the fluorine-free tungsten barrier layer is formed in step S5. In the third method, the pre-treatment of step S4 is performed before the fluorine-free tungsten barrier layer is formed in step S5, and the post-treatment of step S6 is performed after the fluorine-free tungsten barrier layer is formed in step S5. Step S1 of forming the trench, step S2 of forming the gate dielectric layer, step S3 of performing the plasma nitridation process, step S5 of forming the fluorine-free tungsten barrier layer, step S7 of filling the trench with the bulk tungsten layer, step S8 of performing the annealing process and step S9 of performing the recessing process are the same processes as in the first to third methods.

Step S5 of forming the fluorine-free tungsten barrier layer may be referred to as the forming of the first tungsten layer 104 which is described in the first embodiment. Additionally, step S5 of forming the fluorine-free tungsten barrier layer may be referred to as the forming of the second tungsten layer 114B which is described in the second embodiment. Step S4 of performing the pre-treatment may be referred to as the forming of the first tungsten layer 114A which is described in the second embodiment or the performing of the pre-treatment before the forming of the first tungsten layer 104 which is described in the first embodiment. Step S7 of filling the trench with the bulk tungsten layer may be referred to as the forming of the second tungsten layer 105 which is described in the first embodiment and the forming of the third tungsten layer 115 which is described in the second embodiment.

Hereafter, the first and third methods are described in detail with reference to the buried gate structure shown in FIG. 2.

The trench 102 is formed by etching the substrate 101 to a predetermined depth in step S1.

The gate dielectric layer 103 formed on the surface of the trench 102 during step S2.

The plasma nitridation process is performed on the gate dielectric layer 103 in step S3. Step S3 of performing the plasma nitridation process may nitrify the upper surface of the gate dielectric layer 103. A stable interface characteristic between the gate dielectric layer 103 and the fluorine-free tungsten barrier layer 114 may be secured based on step S3 of performing the plasma nitridation process.

Step S4 of performing the pre-treatment is carried out using high-frequency plasma. For example, step S4 of performing the pre-treatment is carried out using hydrogen plasma. The pre-treatment of step S4 may be performed using mixed plasma of hydrogen and argon (H$_2$/Ar plasma). The pre-treatment of step S4 may be performed with high-frequency plasma power as low as approximately 40 W. As the pre-treatment of step S4 is performed using high-frequency plasma power as low as approximately 40 W, plasma induced damage (PID) of the gate dielectric layer 103 may be minimized. As the pre-treatment of step S4 is performed before the fluorine-free tungsten barrier layer is formed in step S5, interface characteristics of the gate dielectric layer 103 and the fluorine-free tungsten barrier layer 114 may be satisfactorily secured. That is, de-lamination is prevented by step 4S of performing the pre-treatment.

Step S4 of performing the pre-treatment and step S5 of forming the fluorine-free tungsten barrier layer may be carried out in situ, in the same chamber. For example, the substrate 101 where the plasma nitridation process of step S3 is performed is loaded in an atomic layer deposition chamber. Subsequently, step S4 of performing the pre-treatment and step S5 of forming the fluorine-free tungsten barrier layer are carried out in situ in the atomic layer deposition chamber. Step S4 of performing the pre-treatment and step S5 of forming the fluorine-free tungsten barrier layer are carried out using low-power high-frequency plasma. Step S4 of performing the pre-treatment is carried out with lower power high-frequency plasma than step S5 of forming the fluorine-free tungsten barrier layer. A fluorine-free tungsten layer is deposited as a barrier layer in step S5 of forming the fluorine-free tungsten barrier layer.

The first tungsten layer 114A may be thinly deposited in step S4 of performing the pre-treatment, and the second tungsten layer 114B may be deposited to have a thickness greater than the first tungsten layer 114A in step S5 of forming the fluorine-free tungsten barrier layer. The deposition process of the first tungsten layer 114A is performed with a high-frequency plasma power that is lower than the deposition process of the second tungsten layer 114B. As the first tungsten layer 114A is deposited with low-power high-frequency plasma, plasma induced damage (PID) of the gate dielectric layer 103 may be minimized and superior interface characteristics may be secured. The first tungsten layer 114A may serve as an interface stabilization layer and the second tungsten layer 114B may serve as a barrier layer.

The fluorine-free tungsten barrier layer 114 is exposed in step S6 of performing the post-treatment. Step S6 of performing the post-treatment is carried out in a cleaning chamber. For example, a substrate is unloaded from the atomic layer deposition chamber and then transferred to the cleaning chamber. In step S6 of performing the post-treatment, the fluorine-free tungsten barrier layer 114 is exposed in the cleaning chamber. Step S6 of performing the post-treatment may be carried out by applying high-frequency plasma. Step S6 of performing the post-treatment may use high-frequency plasma power of approximately 100 W. Step S6 of performing the post-treatment is carried out by implanting hydrogen and nitrogen. The hydrogen is implanted at a flux of approximately 20 sccm and nitrogen is implanted at a flux of approximately 150 sccm. Consequently, the post-treatment of step S6 may include a plasma treatment, which is performed in a mixed atmosphere of hydrogen plasma and nitrogen plasma. The barrier performance of the fluorine-free tungsten barrier layer 114 may be improved, and the interface stability with the gate dielectric layer 103 may be enhanced in step S6 of performing the post-treatment.

The trench 102 is filled with the third tungsten layer 115 in step S7. Step S7 of filling the trench with the bulk tungsten layer may be carried out in a CVD chamber. For example, a substrate is unloaded from the cleaning chamber and then transferred to the CVD chamber. The deposition process of the third tungsten layer 115 is performed in a CVD chamber. The third tungsten layer 115 may be deposited by reacting a tungsten-containing material with a hydrogen-containing material. For example, the third tungsten layer 115 may be deposited by reacting tungsten hexafluoride ($WF_6$) with hydrogen ($H_2$). The third tungsten layer 115 may be formed through a step of performing a nucleation process and a step of performing a deposition process. In step of the nucleation, a bulk tungsten layer having large crystal grains may be deposited using tungsten hexafluoride ($WF_6$) and diborane ($B_2H_6$). In another embodiment of the present invention, the third tungsten layer 115 may use a tungsten-containing material other than tungsten hexafluoride ($WF_6$). The fluorine-free tungsten barrier layer 114 may function as a nucleation layer during the deposition process of the third tungsten layer 115.

In step S8 of performing the annealing process, the third tungsten layer 115 is annealed and formed to have a low-resistivity. Step S8 of performing the annealing process may be referred to as a post-annealing process. Step S8 of performing the annealing process may include a rapid thermal process (RTP). Step S8 of performing the annealing process may be carried out for approximately one hour. Step S8 of performing the annealing process may be carried out in an atmosphere of nitrogen in order to prevent the third tungsten layer 105 from being oxidized. The annealing process of step S8 may be performed at a temperature of approximately 800° C. As the third tungsten layer 105 absorbs heat energy as driving power in step S8 of performing the annealing process, the size of its crystal grains becomes larger, and the phase is changed to have a low coordination number and the impurity concentration, such as carbon, is decreased. When the impurity concentration is decreased in step S8 of performing the annealing process, extremely large crystal grains of an alpha tungsten (α-W) phase are formed.

For example, the carbon concentration in the third tungsten layer 115 is decreased below approximately 20 at %, specifically, from approximately 10 at % to 15 at %, in step S8 of performing the annealing process. Therefore, the crystal grains each become more than 10 times larger. As a result, the third tungsten layer 105 on which the annealing process of step S8 is performed has decreased carbon concentration and large crystal grains, and thus resistivity is reduced over approximately 80% after the third tungsten layer 105 is deposited, compared with the resistivity before the deposition.

The upper portions of the fluorine-free tungsten barrier layer 114 and the third tungsten layer 115 are recessed to have a height lower than the upper surface of the substrate 101 in step S9 of performing the recessing process. The recessing process of step S9 may be performed through an etch-back process.

As step S5 of forming the fluorine-free tungsten barrier layer is included when the buried gate structures 106 and 116 are formed in accordance with the embodiments of the present invention, not only may low gate resistance may be obtained, but also the gate dielectric layer 103 may be protected from being attacked during deposition. Moreover, as the pre-treatment of step S4 and/or the post-treatment of step S6 are/is included, the interface stability between the gate dielectric layer 103 and the buried gate structures 106 and 115 may be improved. The third method may largely improve the interface stability more than the first and second methods.

Hereafter, step S5 of forming the fluorine-free tungsten barrier layer is described with reference to FIG. 6.

Figure 6:
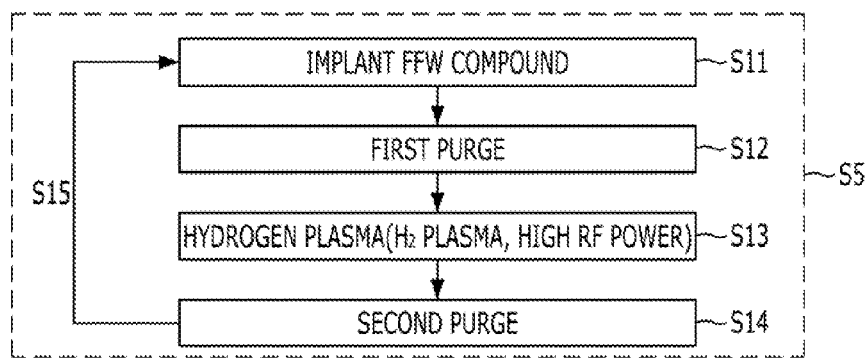
FIG. 6 is a flowchart illustrating an atomic layer deposition (ALD) process for forming a fluorine-free tungsten barrier layer.

FIG. 6 is a flow-chart illustrating an ALD process for step S5 of forming the fluorine-free tungsten barrier layer.

Referring to FIG. 6, the ALD process for step S5 of forming the fluorine-free tungsten barrier layer is performed using a unit cycle which includes implanting a fluorine-free tungsten compound in step S11, performing a first purge process in step S12, implanting hydrogen plasma in step S13 and performing a second purge process in step S14. The fluorine-free tungsten barrier layer having a predetermined thickness may be deposited by repeating the unit cycle several times in step S15. The atomic layer deposition process may be performed with high-frequency plasma power of approximately 40 W to 250 W at a temperature ranging from approximately 100° C. to 300° C.

In step S11 of implanting a fluorine-free tungsten compound, a metal organic-based fluorine-free tungsten compound is adsorbed onto the gate dielectric layer 103 where the plasma nitridation process is performed. In an embodiment of the present invention, the gate dielectric layer 103 may include a silicon oxide ($SiO_2$). The fluorine-free tungsten compound is a tungsten compound not having fluorine. The fluorine-free tungsten compound may be a metal organic tungsten compound. The fluorine-free tungsten compound may include a compound which contains tungsten and carbon. Additionally, the fluorine-free tungsten compound may include a compound which contains tungsten, carbon and nitrogen. For example, the fluorine-free tungsten compound may include dicarbonyl(η5-methyl-cyclopentadienyl)nitrosyl tungsten ($C_8H_7NO_3W$) and bis(tert-butylimino)bis(dimethylamino) tungsten ($C_{12}H_{30}N_4W$). The fluorine-free tungsten layer, which is deposited using the fluorine-free tungsten compound, has low-resistivity and may serve as a barrier for protecting against attack by fluorine. The flux of the fluorine-free tungsten compound may be controlled in such a manner that the carbon content is equal to or less than approximately 40 at %.

The first purge process of step S12 is performed to remove the unabsorbed fluorine-free tungsten compound. The first purge process of step S12 may be performed using an inert gas such as argon.

In step S13 of implanting the hydrogen plasma, an atomic fluorine-free tungsten layer is deposited in a reaction of an adsorbed fluorine-free tungsten compound. The reactant may include a reductant or a reducing gas. The reactant may include a hydrogen-containing material. Step S13 of implanting the hydrogen plasma may include a plasma process using the hydrogen-containing material. Step S13 of implanting the hydrogen plasma may include a plasma process of hydrogen ($H_2$). The fluorine-free tungsten layer is deposited in a reaction between the fluorine-free tungsten compound and the hydrogen by the application of hydrogen plasma. The carbon content of the fluorine-free tungsten layer may be controlled to be less than approximately 40 at % by the hydrogen plasma. To control the carbon content, high-frequency plasma power for generating the hydrogen plasma may be controlled. Impurities such as nitrogen and oxygen, which are contained in the fluorine-free tungsten layer, may be removed by the hydrogen plasma.

The second purge process of step S14 is performed to remove superfluous reactants and reaction by-products. The second purge process of step S14 may be performed using an inert gas such as argon.

While step S11 of implanting the fluorine-free tungsten compound, step S12 of performing the first purge process, step S13 of implanting the hydrogen plasma and step S14 of performing the second purge process are carried out, hydrogen and argon may be implanted. For example, argon may continuously implanted while step S11 of implanting the fluorine-free tungsten compound, step S12 of performing the first purge process, step S13 of implanting the hydrogen plasma and step S14 of performing the second purge process are carried out. The hydrogen may be implanted while step S12 of performing the first purge process, step S13 of implanting the hydrogen plasma and step S14 of performing the second purge process are carried out. The hydrogen, which is implanted in steps S12 and S14 of the first and second purge processes, is for purging, and the hydrogen, which is implanted in step S13 of implanting the hydrogen plasma, is for reacting with the fluorine-free tungsten compound. The high-frequency plasma power is used in step S13 of implanting the hydrogen plasma. Therefore, the hydrogen plasma is generated by the high-frequency plasma power in step S13 of implanting the hydrogen plasma. Consequently, the fluorine-free tungsten layer is deposited in a reaction between the fluorine-free tungsten compound and the hydrogen plasma. High-frequency plasma power of approximately 150 W is used.

The fluorine-free tungsten layer may have a thickness of approximately 20 Å to 30 Å. Step coverage of the fluorine-free tungsten layer is quite thorough as an ALD process is used. The fluorine-free tungsten layer may be a fluorine-free tungsten carbon (FFWC) layer in which a trace of carbon is contained. The carbon content of the fluorine-free tungsten carbon (FFWC) layer may range from approximately 25 at % to 35 at %. The low carbon content may be obtained through the hydrogen plasma process.

The fluorine-free tungsten layer is formed using the fluorine-free tungsten compound. Since fluorine is not contained in the layer, the gate dielectric layer 103 is protected from being attacked by fluorine. The fluorine-free tungsten layer may protect the gate dielectric layer 103 from being attacked by fluorine while a bulk tungsten layer is deposited. The fluorine-free tungsten layer may be used as a nucleation layer for depositing the bulk tungsten layer.

Figure 7:
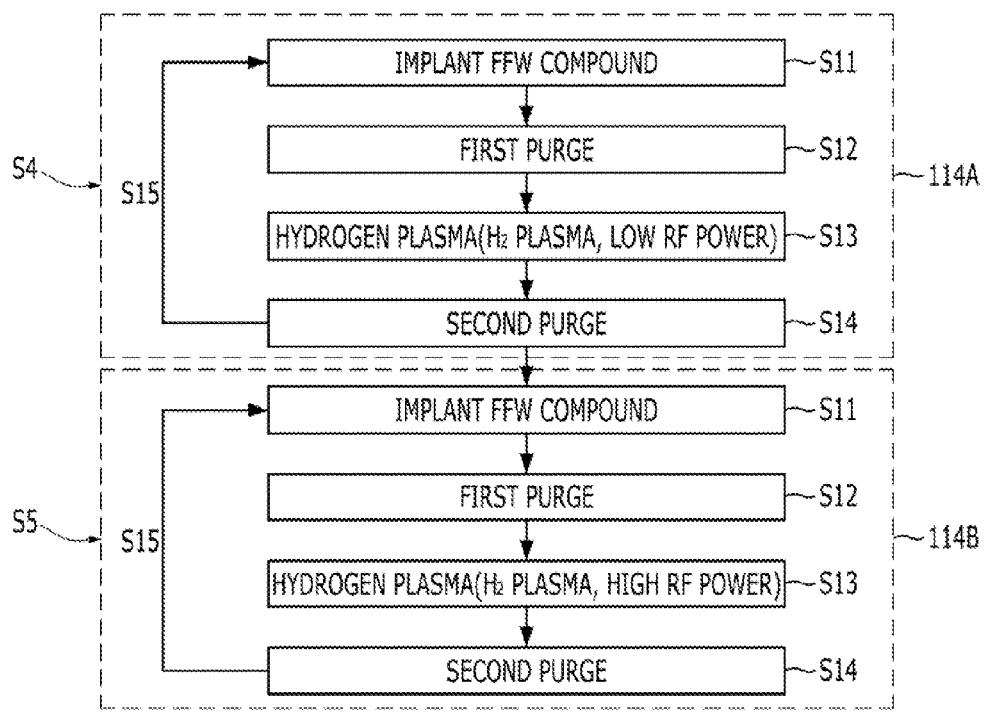
FIG. 7 is a flowchart illustrating an atomic layer deposition process for performing a pre-treatment and forming a fluorine-free tungsten barrier layer.

FIG. 7 is a flowchart describing an ALD process for performing the pre-treatment and forming the fluorine-free tungsten barrier layer. The first tungsten layer 114A may be deposited through step S4 of performing the pre-treatment, and the second tungsten layer 114B may be deposited through step S5 of forming the fluorine-free tungsten barrier layer. FIG. 7 illustrates an atomic layer deposition process of a bilayer fluorine-free tungsten barrier layer.

Referring to FIGS. 7 and 2, the atomic layer deposition process of the bilayer fluorine-free tungsten barrier layer 114 includes a first unit cycle and a second unit cycle. The first unit cycle may be for step S4 of performing the pre-treatment, and the second unit cycle may be for step S5 of forming the fluorine-free tungsten barrier layer. The first tungsten layer 114A where fluorine is not contained is deposited by the first unit cycle. The second tungsten layer 114B where fluorine is not contained is deposited by the second unit cycle. The first unit cycle and the second unit cycle include step S11 of implanting the fluorine-free tungsten compound, step S12 of performing the first purge process, step S13 of implanting the hydrogen plasma and step S14 of performing the second purge process, respectively. The first unit cycle and the second unit cycle are the same as the unit cycle shown in FIG. 6. The first tungsten layer 114A having a predetermined thickness may be deposited through step S15 of repeating the first unit cycle several times, for example, approximately 10 times. The second tungsten layer 114B having a predetermined thickness may be deposited through step S15 of repeating the second unit cycle several times, for example, approximately 120 times. The atomic layer deposition process using the first and second unit cycles may proceed at a temperature ranging from approximately 100° C. to 300° C. Argon may be additionally implanted at a flux of approximately 800 sccm, and hydrogen may be implanted at a flux of approximately 500 sccm during step S13 of implanting the hydrogen plasma.

The first unit cycle and the second unit cycle have different high-frequency plasma power for generating the hydrogen plasma. The high-frequency plasma power may be selected in the range of approximately 40 W to 250 W.

First high-frequency plasma power is used to deposit the first tungsten layer 114A. Second high-frequency plasma power is used to deposit the second tungsten layer 114B. The first high-frequency plasma power is lower than the second high-frequency plasma power. The first high-frequency plasma power is selected to prevent plasma damage of the gate dielectric layer 103. The second high-frequency plasma power is selected to obtain sufficient thickness to serve as a barrier layer. For example, a second high-frequency plasma power of approximately 150 W may be used, and a first high-frequency plasma power of approximately 40 W may be used. When the first high-frequency plasma power lower than approximately 40 W is used, the first tungsten layer 114A may not be uniformly deposited, and thus the interface stability may be weak. Although described below, when the second high-frequency plasma with power higher than approximately 250 W is used, the C-V characteristics and the leakage current characteristics may deteriorate.

As the first high-frequency plasma power, which is low relative to the power of the second high-frequency plasma, is used, the gate dielectric layer 103 is protected from plasma damage while the first tungsten layer 114A is deposited. As the second high-frequency plasma power, which is high relative to the first high-frequency plasma power, is used, the deposition rate of the second tungsten layer 114B may be improved. Therefore, the tungsten layers may have a thickness sufficient to serve as a barrier.

As a result, as the first tungsten layer 114A is deposited with the low-power first high-frequency plasma in the pre-treatment of step S4, plasma damage of the gate dielectric layer 103 may be minimized, and a fluorine-free tungsten barrier layer 114 having beneficial interface characteristics may be deposited without de-lamination. Additionally, the resistivity of the buried gate structure 116 may be considerably reduced since the buried gate structure 116 is formed of tungsten-based materials.

Figure 8:
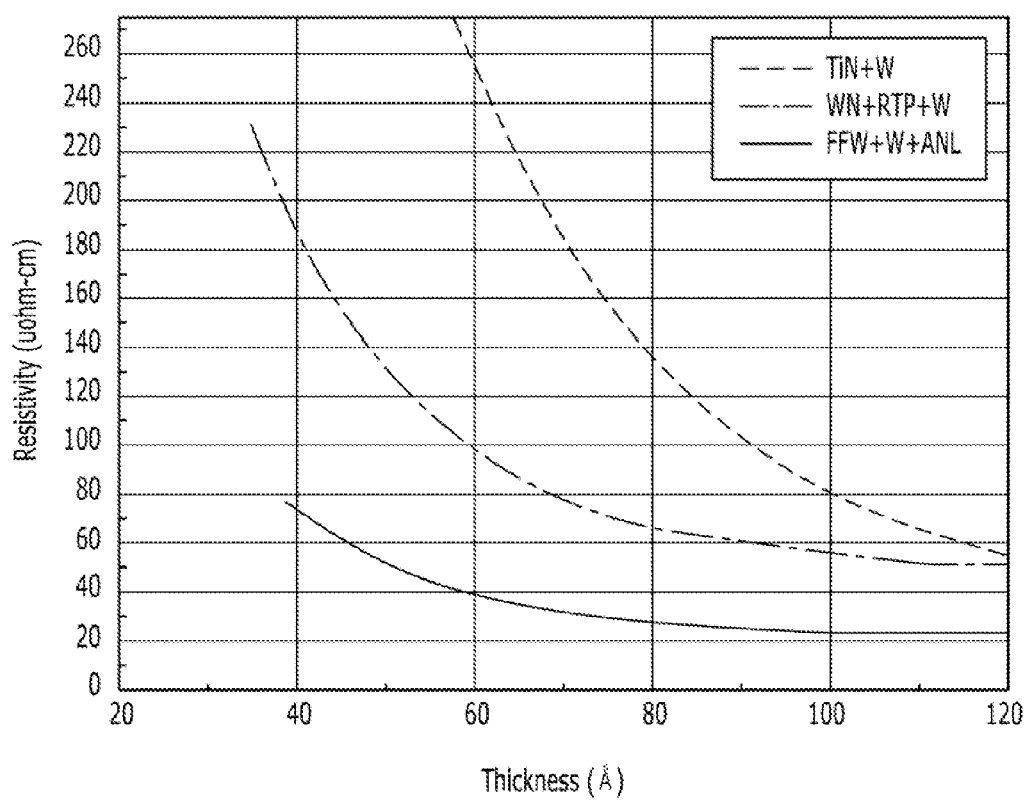
FIG. 8 is a graph illustrating resistivities of materials used for forming a metal gate electrode.

FIG. 8 is a graph illustrating resistivities of materials used for forming a metal gate electrode. FIG. 8 is a graph illustrating resistance of a first sample TiN and W in which a titanium nitride and tungsten are stacked, a second sample WN and W in which a tungsten nitride and tungsten are stacked, and a third sample FFW and W in which fluorine-free tungsten and tungsten are stacked. The second sample goes through a rapid thermal process (RTP) before the tungsten is formed, and the third sample is annealed (ANL) after the fluorine-free tungsten and the tungsten are formed. The tungsten is used as an electrode, and a titanium nitride (TiN), a tungsten nitride (WN) and fluorine-free tungsten (FFW) are used as barrier layers, respectively, in the first to third samples. The tungsten is bulk tungsten, in the first to third samples.

Referring to FIG. 8, the resistivity of the third sample FFW and W including the fluorine-free tungsten (FFW) is reduced considerably more than the first sample TiN and W and the second sample WN and W.

For example, when it is presumed that the second sample and the third sample have an individual thicknesses of approximately 60 Å, the resistivity of the third sample is as low as approximately 40 $\mu\Omega$cm while the resistivity of the second sample is approximately 100 $\mu\Omega$cm. The resistivity of the first sample is approximately 240 $\mu\Omega$cm, which is quite large. [Please recheck the unit of the resistivity. Thank you.]

The tungsten-based buried gate structure having the low resistivity may be formed by using fluorine-free tungsten (FFW) in accordance with the embodiments of the present invention.

Consequently, by using the fluorine-free tungsten (FFW) as the barrier layer, the resistivity of the tungsten-based buried gate structure may be reduced more than the resistivity of the buried gate structure which uses a tungsten nitride or a titanium nitride as a barrier layer.

The following Table 1 compares the resistivity of the third sample after the deposition process and the annealing process are performed. The results shown in the Table 1 are an example in which the fluorine-free tungsten and the bulk tungsten are both formed to a thickness of approximately 30 Å.

TABLE 1

| Condition | Items | W/FFW (30 Å/30 Å) |
|---|---|---|
| After deposition process | Resistivity | 175.9 |
| After annealing process | Resistivity | 36.1 |

Referring to Table 1, the resistivity of the third sample is reduced to 36.1 $\mu\Omega$cm through step S8 of performing the annealing process although the resistivity of the third sample is approximately 175.9 $\mu\Omega$cm after the deposition process is performed. Through the annealing process of step S8 the resistivity of the third sample is remarkably reduced by over approximately 80%.

Figure 9A:
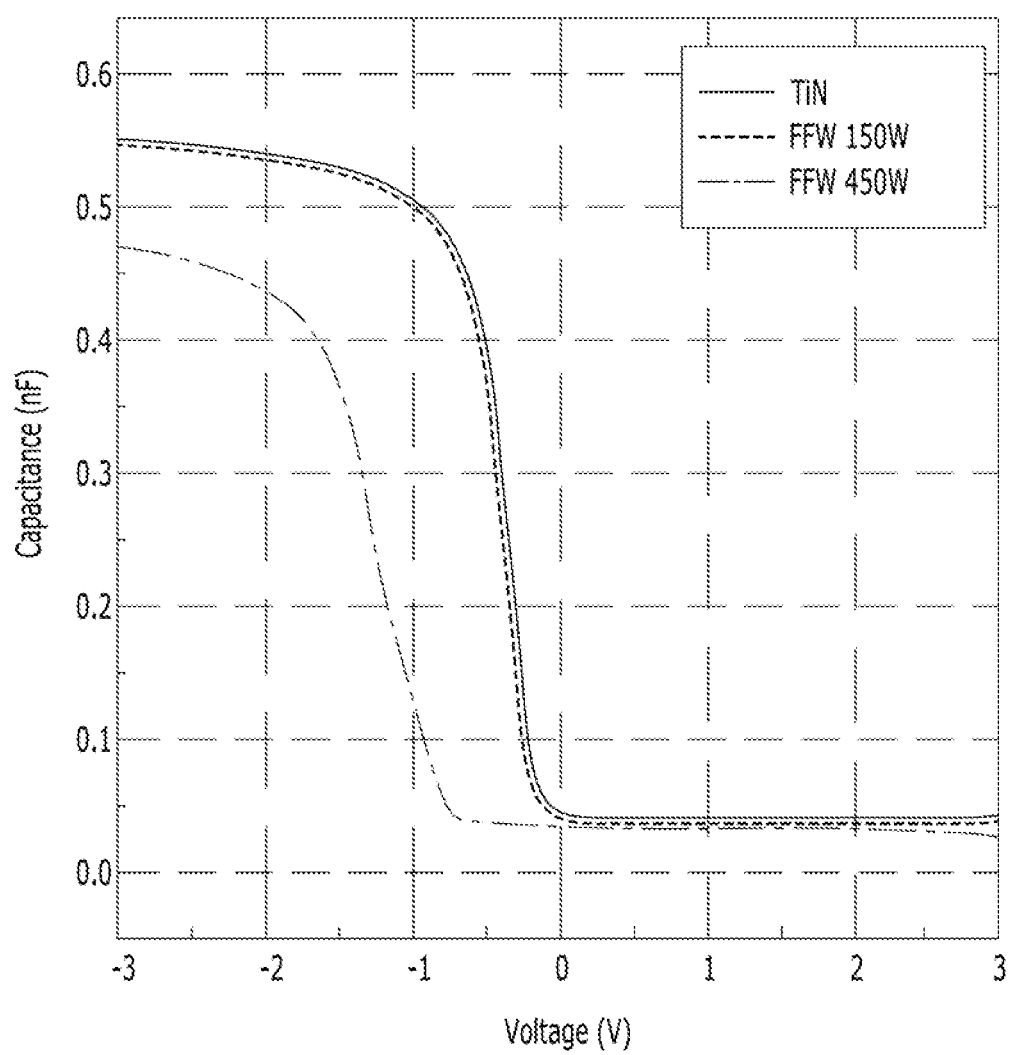
FIG. 9A is a graph illustrating C-V characteristics based on the variation in high-frequency plasma power and temperature.
Figure 9B:
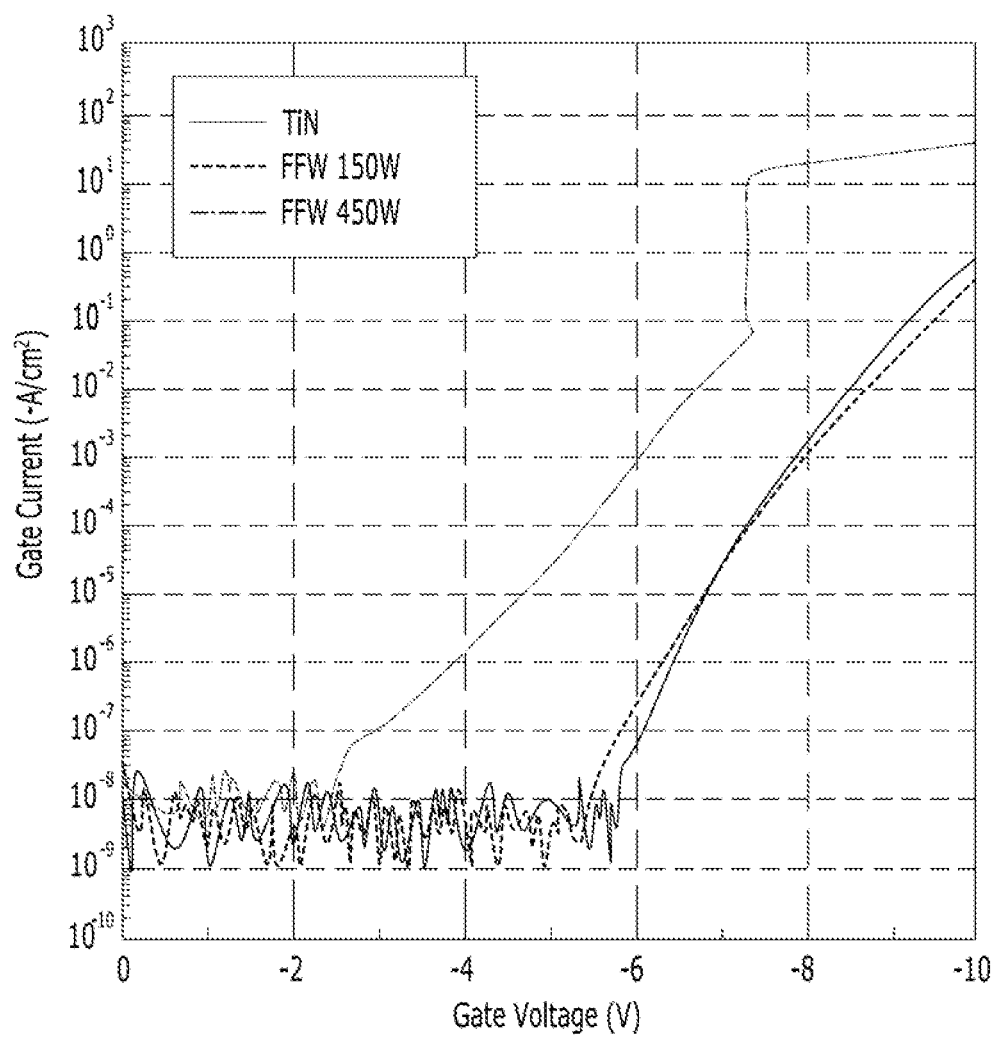
FIG. 9B is a graph illustrating a leakage current based on the variation in high-frequency plasma power and temperature.

FIG. 9A is a graph illustrating C-V characteristics based on the variation in high-frequency plasma power and temperature. FIG. 9B is a graph illustrating leakage current based on the variation in high-frequency plasma power and temperature. In FIGS. 9A and 9B, the C-V characteristics and the leakage current are measured using an embodiment of FFW 150 W, an example 1 of FFW 450 W, and an example 2 of TiN. The embodiment of FFW 150 W is an example where fluorine-free tungsten (FFW) is deposited with high-frequency plasma power of approximately 150 W. The example 1 of FFW 450 W has fluorine-free tungsten (FFW) deposited at a high-frequency plasma power of approximately 450 W. The example 2 of TiN is an example where a titanium nitride is applied as a barrier layer.

Referring to FIG. 9A, it may be difficult to apply the example 1 of FFW 450 W deposited by the high-power high-frequency plasma of approximately 450 W to the buried gate structure since the capacitance is reduced. This is due to plasma induced damage (PID) by the high-power high-frequency plasma.

The embodiment of FFW 150 W shows similar C-V characteristics as example 2 of TiN where a titanium nitride is applied. Although fluorine-free tungsten and bulk tungsten FFW and W are applied as a buried gate structure, there is no deterioration of the C-V characteristic.

The C-V characteristic suitable for a PMOSFET or an NMOSFET may be obtained by properly changing the high-frequency plasma power and deposition temperature while the fluorine-free tungsten (FFW) is deposited. For example, the high-frequency plasma power is controlled in the range of approximately 50 W to 250 W. The deposition temperature is controlled in the range of approximately 150° C. to 250° C. It may be possible to control the work function and to target a threshold voltage by properly controlling the high-frequency plasma power and the deposition temperature. That is, the work function may be reduced to be suitable for the NMOSFET and the work function may be increased to be suitable for the PMOSFET.

Referring to FIG. 9B, it may be difficult to apply the example 1 of FFW 450 W deposited by high-power high-frequency plasma of approximately 450 W to the buried gate structure since leakage current is increased. This is due to the plasma induced damage (PID) by the high-power high-frequency plasma.

The embodiment of FFW 150 W shows similar leakage current characteristics as the case of applying a titanium nitride. There is no deterioration of the leakage current characteristics although fluorine-free tungsten and bulk tungsten FFW and W are applied as a buried gate structure.

As described in FIGS. 9A and 9B, similar C-V characteristics and leakage current characteristics of applying fluorine-free tungsten and bulk tungsten FFW and W may be obtained, although the fluorine-free tungsten and the bulk tungsten FFW and W are applied. Additionally, the buried gate structure may have a resistance lower than FFW and W, TiN and W, and WN and W, in accordance with the embodiments of the present invention.

Figure 10:
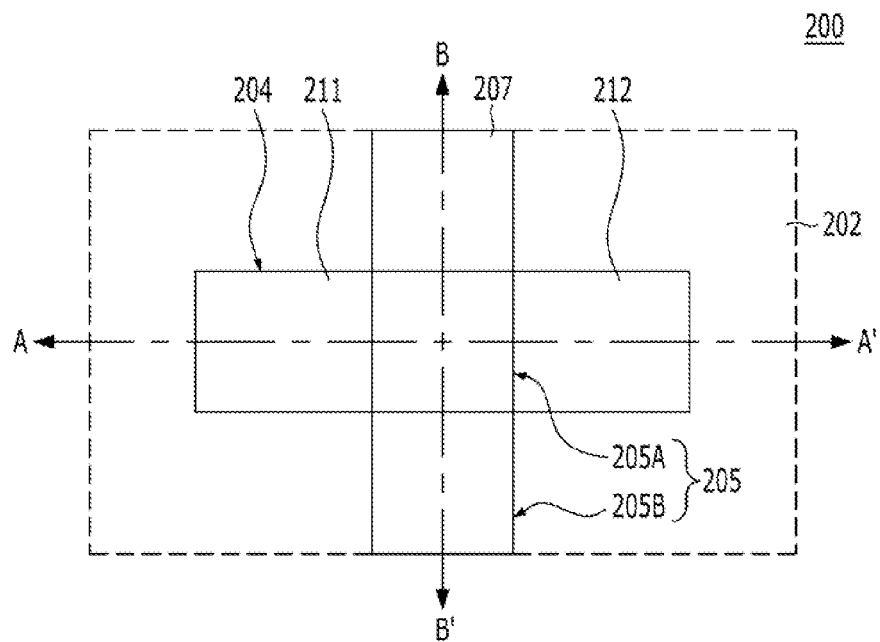
FIG. 10 is a plan view illustrating a transistor including a buried gate electrode in accordance with the embodiments of the present invention.
Figure 11A:
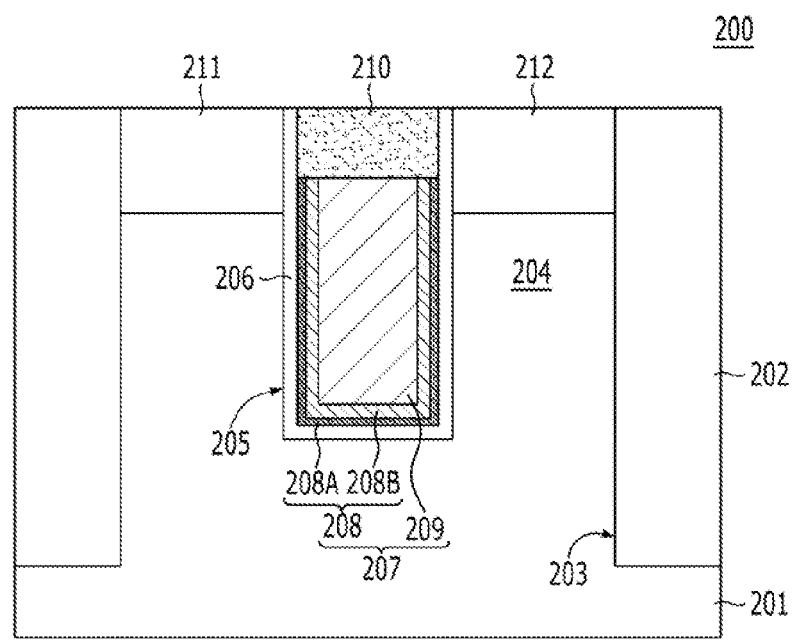
FIG. 11A is a cross-sectional view illustrating the transistor taken along an A-A' line shown in FIG. 10.
Figure 11B:
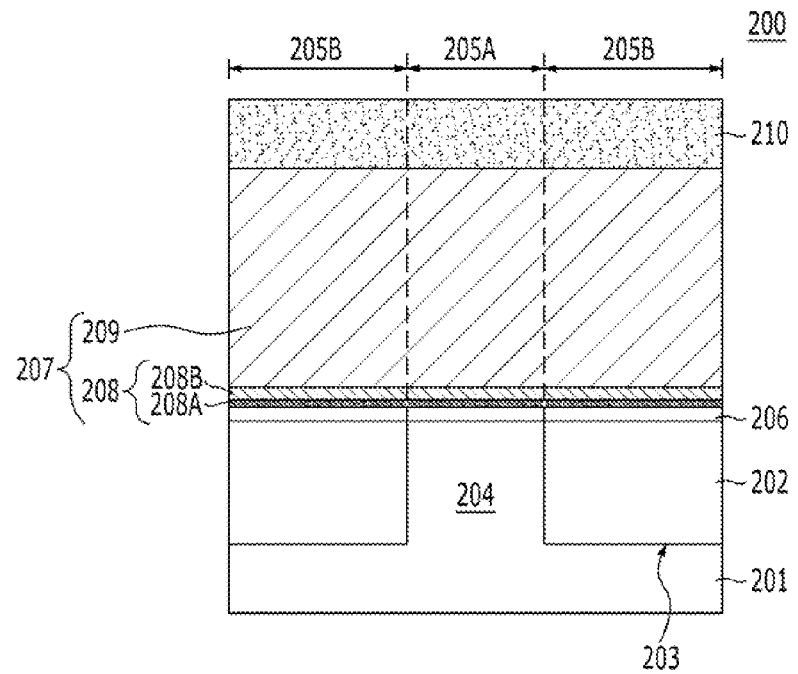
FIG. 11B is a cross-sectional view illustrating the transistor taken along a B-B' line shown in FIG. 10.

FIG. 10 is a plan view illustrating a transistor including the buried gate structure in accordance with the embodiments of the present invention. FIG. 11A is a cross-sectional view illustrating the transistor taken along an A-A' line shown in FIG. 10. FIG. 11B is a cross-sectional view illustrating the transistor taken along a B-B' line shown in FIG. 10.

Hereafter, the transistor is described with reference to FIGS. 10, 11A and 11B.

A substrate 201 may include a semiconductor substrate. The substrate 201 may be a silicon substrate. An isolation region 202 is formed in the substrate 201. The isolation region 202 may include an isolation dielectric layer which is gap-filled in an isolation trench 203. An active region 204 is defined by the isolation region 202 in the substrate 201.

A trench 205 is formed with a predetermined depth in the substrate 201. The trench 205 may be a shape of a line which is extended in a direction. The trench 205 has a shape crossing the active region 204 and the isolation region 202. The trench 205 has a depth shallower than the isolation trench 203. The trench 205 includes a first portion 205A and a second portion 205B. The first portion 205A is formed in the active region 204. The second portion 205B is formed in the isolation region 202. The first portion 205A may be sequentially extended to the second portion 205B. The bottom surface of the first portion 205A may be disposed on the same level as the bottom surface of the second portion 205B.

A first impurity region 211 and a second impurity region 212 are formed in the substrate 201. The first impurity region 211 and the second impurity region 212 are doped with a conductive impurity. For example, the conductive impurity may include phosphorus (P) or boron (B). The first impurity region 211 and the second impurity region 212 are formed in the active region 204 of both sides of the trench 205. The first impurity region 211 and the second impurity region 212 correspond to a source region and a drain region, respectively. The lower surfaces of the first impurity region 211 and the second impurity region 212 may be disposed at a predetermined depth from the upper surface of the active region 204. The first impurity region 211 and the second impurity region 212 may contact the sidewalls of the trench 205. The lower surfaces of the first impurity region 211 and the second impurity region 212 may be higher than the bottom surface of the trench 205.

A gate dielectric layer 206 is formed on the bottom and sidewalls of the trench 205. The gate dielectric layer 206 may include at least one among a silicon oxide, a silicon nitride, a silicon oxynitride or a high-k material. The dielectric constant of the high-k material may be higher than the dielectric constants of the silicon oxide and the silicon nitride. A plasma nitridation process may be performed on the surface of the gate dielectric layer 206.

A buried gate structure 207 is formed in the trench 205. The buried gate structure 207 includes a fluorine-free tungsten barrier layer 208 and a bulk tungsten electrode 209. The fluorine-free tungsten barrier layer 208 is a bilayer of a first fluorine-free tungsten layer 208A and a second fluorine-free tungsten layer 208B. The bulk tungsten electrode 209 partially fills the trench 205 over the fluorine-free tungsten barrier layer 208. The upper surface of the fluorine-free tungsten barrier layer 208 is the same height as the upper surface of the bulk tungsten electrode 209. A capping layer 210 is formed in the upper portions of the fluorine-free tungsten barrier layer 208 and the bulk tungsten electrode 209.

The transistor 200 is formed of the buried gate structure 207, the first impurity region 211 and the second impurity region 212. A channel of the transistor 200 may be formed following the trench 205 between the first impurity region 211 and the second impurity region 212.

Figure 12A:
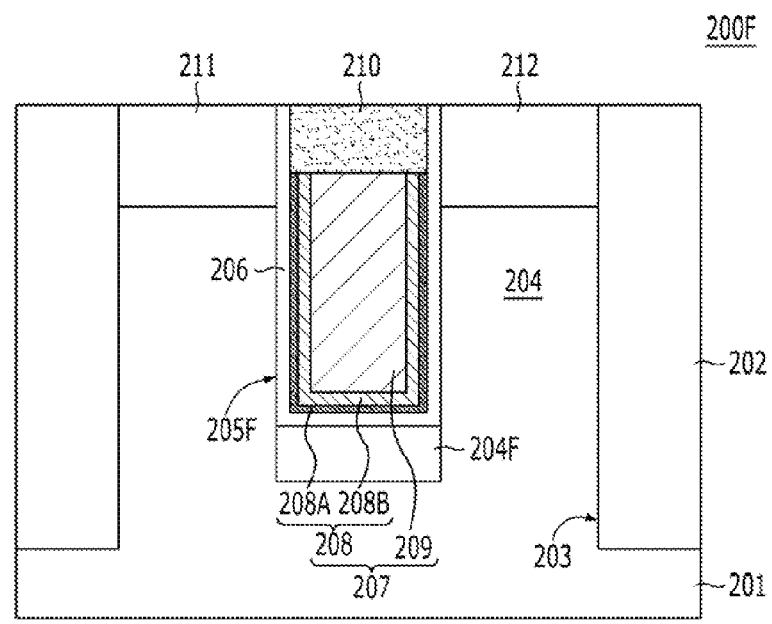
FIGS. 12A and 12B are plan views illustrating a transistor including a buried gate electrode in accordance with the embodiments of the present invention.
Figure 12B:
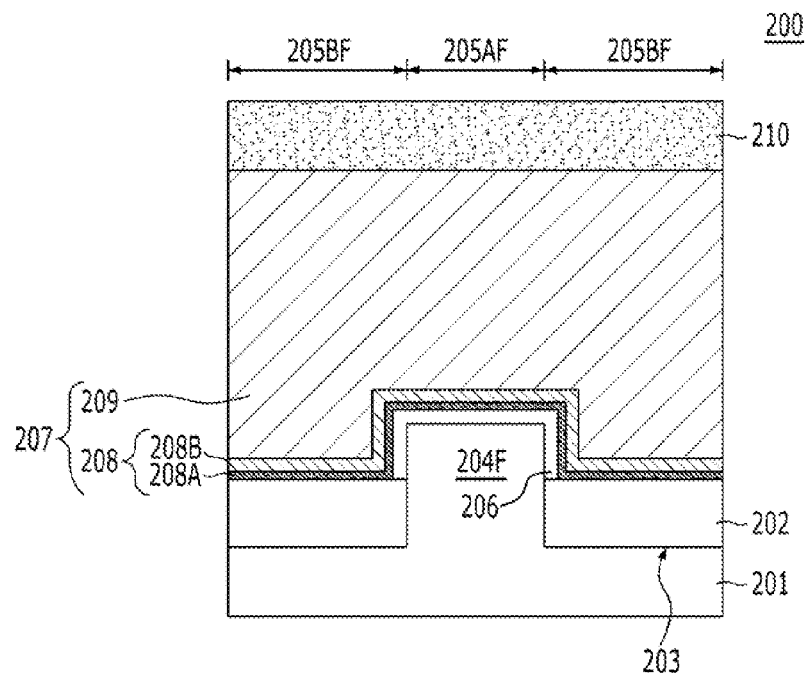

FIGS. 12A and 12B are plan views exemplarily illustrating a transistor including the buried gate structure in accordance with the embodiments of the present invention. FIG. 12A is a cross-sectional view illustrating the transistor taken along an A-A' line shown in FIG. 10. FIG. 12B is a cross-sectional view illustrating the transistor taken along a B-B' line shown in FIG. 10. The components and configurations of the transistor shown in FIGS. 12A and 12B may be similar to those of the transistor shown in FIGS. 11A and 11B. Detailed description on the similar components and configurations is omitted.

Referring to FIGS. 12A and 12B, the trench 205F includes a first portion 205AF and a second portion 205BF. The first portion 205AF is formed in the active region 204. The second portion 205BF is formed in the isolation region 202. The first portion 205AF may be sequentially extended to the second portion 205BF. The first portion 205AF and the second portion 205BF in the trench 205F may have bottom surfaces which are disposed on different levels. For example, the bottom surface of the first portion 205AF may be disposed on a higher level than the bottom surface of the second portion 205BF. A difference in height between the first portion 205AF and the second portion 205BF is made as the isolation region 202 below the trench 205F is recessed. The second portion 205BF in the trench 205F includes a recess region having a bottom surface which is disposed lower than the bottom surface of the first portion 205AF.

A fin region 204F is formed in the active region 204 due to the difference between the first portion 205AF and the second portion 205BF in the trench 205F. The fin region 204F is formed below the trench 205F and the sidewalls of the fin region 204F are exposed by the recess region. The fin region 204F is a region where a channel is formed. The fin region 204F is referred to as a saddle fin region. The channel width may increase and electrical characteristics may improve by utilizing a fin region 204F. The gate dielectric layer 206 is formed on the upper surface and sidewalls of the fin region 204F. The fluorine-free tungsten barrier layer 208 has a shape that covers the sidewalls and upper portion of the fin region 204F. The bulk tungsten electrode 209 is formed in the trench 205F by filling the recess region. The cross-sectional area of the bulk tungsten electrode 209 is larger in the isolation region 202 than in the active region 204.

The buried gate structure 207, the first impurity region 211 and the second impurity region 212 become a buried gate-type fin channel transistor 200F.

FIGS. 13A to 13G are cross-sectional views exemplarily illustrating a method for fabricating the transistor in accordance with the embodiments of the present invention. FIGS. 13A to 13G are cross-sectional views illustrating the transistor taken along an A-A' line shown in FIG. 10.

Figure 13A:
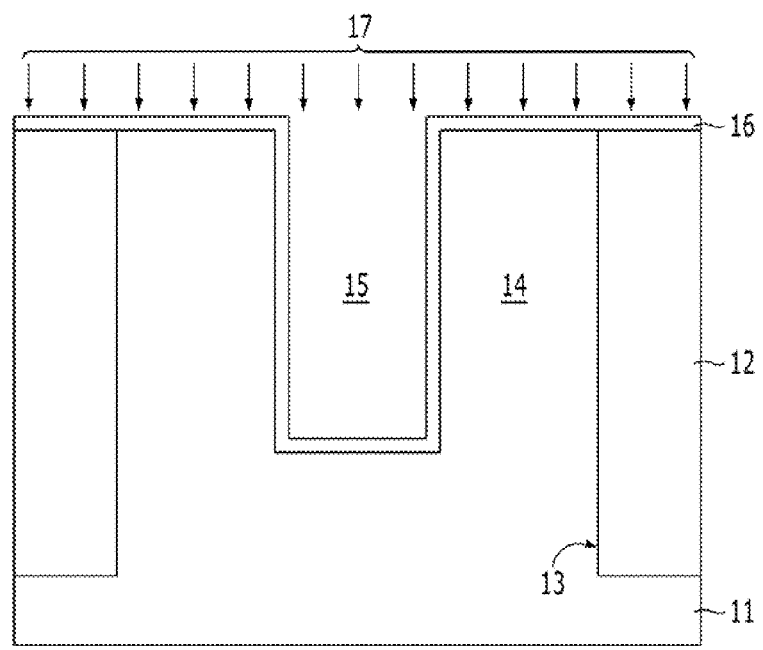
FIGS. 13A to 13G are cross-sectional views exemplarily illustrating a method for fabricating the transistor in accordance with the embodiments of the present invention.

Referring to FIG. 13A, an isolation region 12 is formed in a substrate 11. An active region 14 is defined by the isolation region 12. The isolation region 12 may be formed through a shallow trench isolation (STI) process. For example, after a pad layer (not shown) is formed over the substrate 11, the pad layer and the substrate 11 are etched using an isolation mask (not shown). Consequently, an isolation trench 13 is formed. The isolation region 12 is formed by gap-filling the isolation trench 13 with an insulating material. The isolation region 12 may form sequentially a wall oxide, a liner and a gap-fill dielectric material. The liner may be formed by stacking a silicon nitride and a silicon oxide. The silicon nitride may include $Si_3N_4$, and the silicon oxide may include $SiO_2$. The gap-fill dielectric material may include a spin-on-dielectric (SOD) material. In another embodiment of the present invention, the isolation region 12 may use a silicon nitride as the gap-fill dielectric material.

A trench 15 is formed in the substrate 11. The trench 15 may have a shape of a line crossing the active region 14 and the isolation region 12. A mask pattern (not shown) is formed over the substrate 11, and the trench 15 may be formed through an etch process using the mask pattern as an etch mask. The trench 15 may be formed more shallowly than the isolation trench 13. In another embodiment of the present invention, before the trench 15 is formed, a fin region (not shown) may be formed by recessing the isolation region 12 to a predetermined depth.

A gate dielectric layer 16 is formed on the surface of the trench 15. The gate dielectric layer 16 may be formed through a thermal oxidation process. In another embodiment of the [present invention, the gate dielectric layer 16 may be formed through a CVD process or an ALD process. The gate dielectric layer 16 may include at least one of a high-k material, an oxide, a nitride or an oxynitride. The dielectric constant of the high-k material may be higher than dielectric constants of the silicon oxide and the silicon nitride. For example, the high-k material may be at least one selected from a metal oxide, such as a hafnium oxide or an aluminum oxide.

A plasma nitridation process 17 is performed. The plasma nitridation process 17 is performed to secure stable interface characteristics between the gate dielectric layer 16 and the fluorine-free tungsten barrier layer.

Figure 13B:
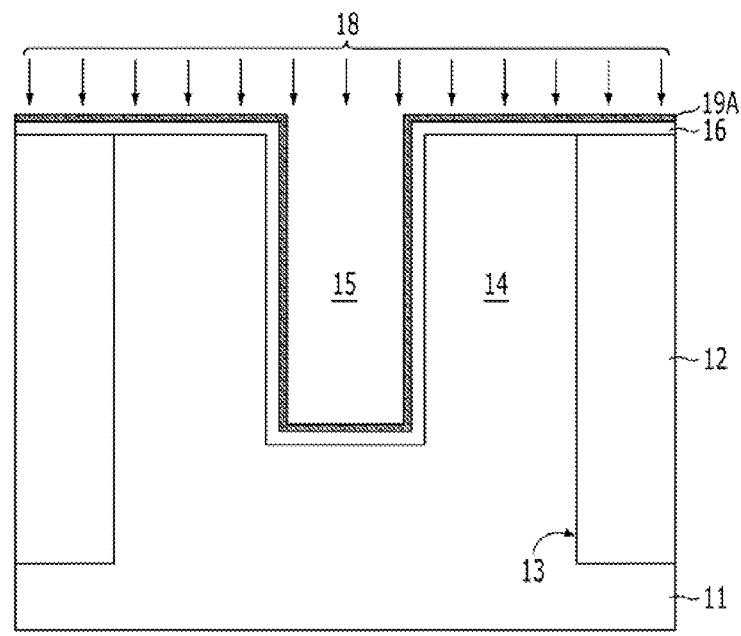

Referring to FIG. 13B, a pre-treatment 18 is performed. The pre-treatment 18 is performed after the substrate 11 where the plasma nitridation process 17 is performed, is loaded in an atomic layer deposition chamber. After the substrate 11 is loaded in a chamber where an atomic layer deposition process of the fluorine-free tungsten barrier layer is performed, the pre-treatment 18 is performed. The pre-treatment 18 is performed by applying a first high-frequency plasma power. A first fluorine-free tungsten thin layer 19A is deposited through the pre-treatment 18.

Figure 13C:
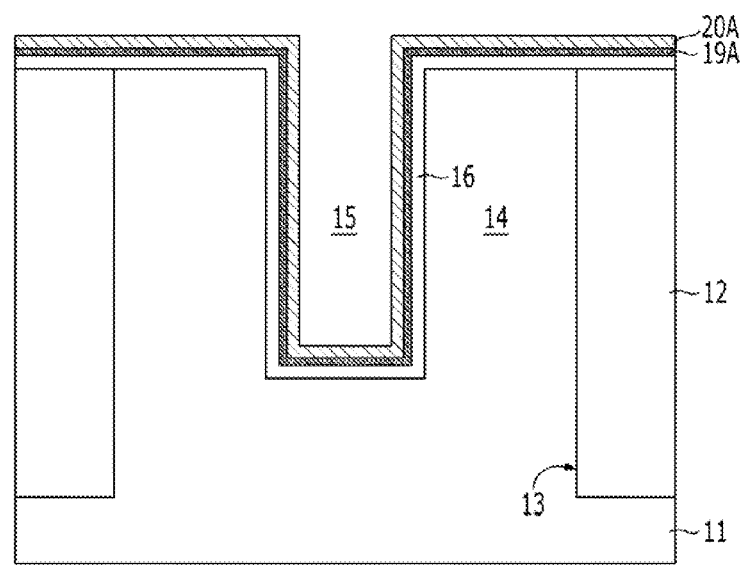

Referring to FIG. 13C, a second fluorine-free tungsten layer 20A is formed. The second fluorine-free tungsten layer 20A is formed through an ALD process using a second high-frequency plasma power. The second high-frequency plasma power is higher than the first high-frequency plasma power for the deposition of the first fluorine-free tungsten layer 19A. As a result, the deposition rate of the second fluorine-free tungsten layer 20A increases. The first fluorine-free tungsten layer 19A is formed shallower than the second fluorine-free tungsten layer 20A.

As the second fluorine-free tungsten layer 20A is deposited, a bilayer fluorine-free tungsten layer 19A and 20A is formed.

Figure 13D:
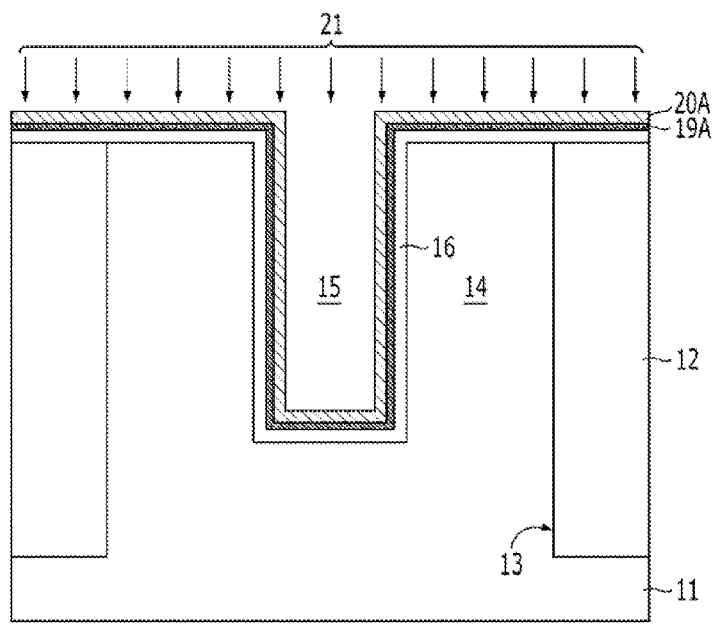

Referring to FIG. 13D, a post-treatment 21 is performed. The barrier performance of the bilayer fluorine-free tungsten layer 19A and 20A is enhanced through the post-treatment 21. Additionally, the interface stability between the bilayer fluorine-free tungsten layer 19A and 20A and the gate dielectric layer 16 increases.

The post-treatment 21 may perform a Nitrogen ($N_2$) process by using a third high-frequency plasma power as an energy source. The post-treatment 21 may be performed in a cleaning chamber. The third high-frequency plasma power is lower than the second high-frequency plasma power and higher than the first high-frequency plasma power.

Figure 13E:
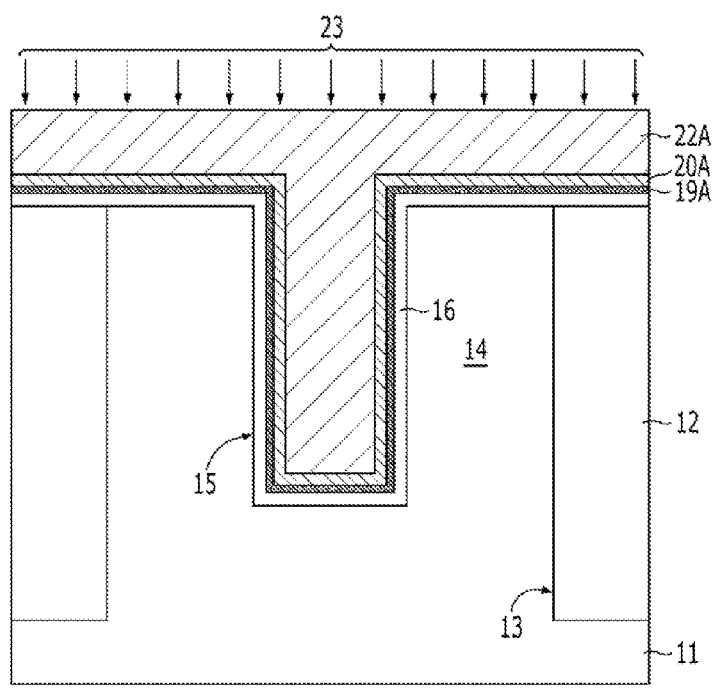

Referring to FIG. 13E, a bulk tungsten layer 22A is formed. The trench 15 is filled with the bulk tungsten layer 22A through a CVD process. A multi-station sequential deposition (MSSD) process using a pulsed nucleation layer (PNL) technique may be applied to the CVD process.

An annealing process 23 is performed. The bulk tungsten layer 22A has a reduced impurity concentration and large crystal grains formed through the annealing process 23. Thus the resistivity is greatly reduced to approximately 80% more than after the bulk tungsten layer 22A is deposited.

Figure 13F:
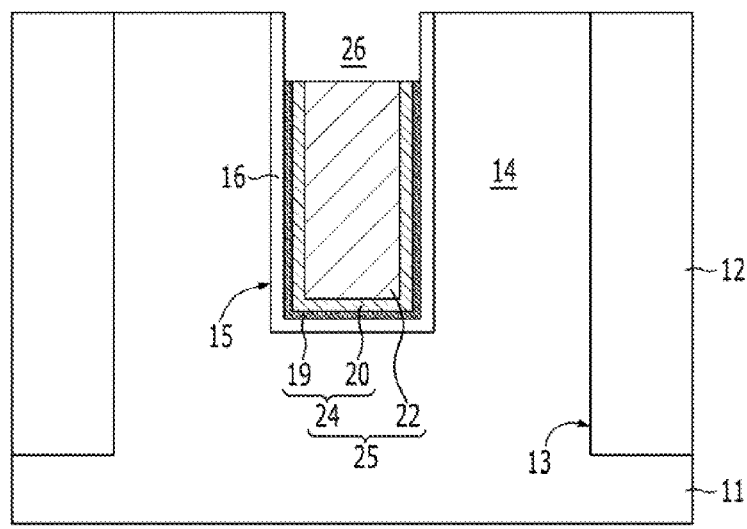

Referring to FIG. 13F, a recessing process is performed so that a bulk tungsten layer and a fluorine-free tungsten layer remain in the trench 15. The recessing process includes an etch-back process, and a recessed gap region 26 is formed. A fluorine-free tungsten barrier layer 24 and a bulk tungsten electrode 22 are formed through the recessing process. The fluorine-free tungsten barrier layer 24 is a bilayer of a first fluorine-free tungsten layer 19 and a second fluorine-free tungsten layer 20. The fluorine-free tungsten barrier layer 24 is formed by performing the etch-back process on the first fluorine-free tungsten layer 19A and the second fluorine-free tungsten layer 20A. The bulk tungsten electrode 22 is formed by performing an etch-back process on the bulk tungsten layer 22A. Before the etch-back process is performed, a planarization process may be performed.

A buried gate structure 25 is formed in the trench 15. The buried gate structure 25 includes the fluorine-free tungsten barrier layer 24 and the bulk tungsten electrode 22.

Figure 13G:
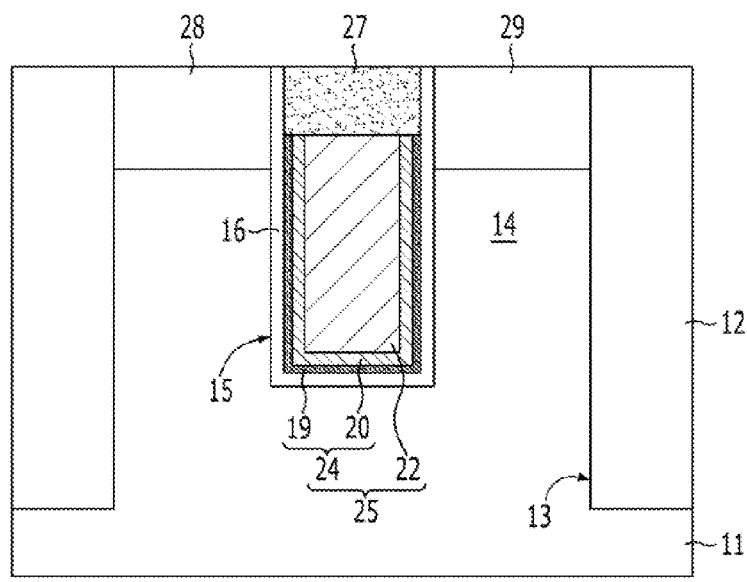

Referring to FIG. 13G, a capping layer 27 is formed over the buried gate structure 25. The capping layer 27 includes a silicon nitride. The silicon nitride is formed to gap-fill the trench 15 over the buried gate structure 25. Subsequently, a planarization process is performed so that the silicon nitride may remain in the trench 15.

A first impurity region 28 and a second impurity region 29 are formed in the substrate 11 through an ion-implantation process of an impurity. The capping layer 27 is used for an ion-implantation barrier.

FIG. 14 is a cross-sectional view illustrating a semiconductor device including a transistor in accordance with the embodiments of the present invention.

Referring to FIG. 14, the semiconductor device 300 includes a first transistor 320 and a second transistor 330. The first transistor 320 and the second transistor 330 are formed in a substrate 301 and are isolated from each other by an isolation region 302.

The first transistor 320 includes a buried gate structure 305, a first source region 309 and a first drain region 310. The buried gate structure 305 is formed in a trench 303. A first gate dielectric layer 304 is formed on the surface of the trench 303. The buried gate structure 305 includes a first fluorine-free tungsten barrier layer 306 and a first bulk tungsten electrode 307. The first fluorine-free tungsten barrier layer 306 is a bilayer of a first fluorine-free tungsten layer 306A and a second fluorine-free tungsten layer 306B. A capping layer 308 is formed over the first bulk tungsten electrode 307. A fin region (not shown) may be further formed below the buried gate structure 305.

The second transistor 330 includes a planar gate electrode 334, a second source region 335 and a second drain region 336. A second gate dielectric layer 331 is formed below the planar gate electrode 334. The planar gate electrode 334 may include a second fluorine-free tungsten barrier layer 332 and a second bulk tungsten electrode 333. The second fluorine-free tungsten barrier layer 332 is a bilayer of a third fluorine-free tungsten layer 332A and a fourth fluorine-free tungsten layer 332B. The first and second fluorine-free tungsten barrier layers 306 and 332 may be formed through an ALD process. The first and second bulk tungsten electrodes 307 and 333 may be formed through a CVD process. The second gate dielectric layer 331 may include at least one among a silicon oxide, a silicon nitride, a silicon oxynitride or a high-k material. The dielectric constant of the high-k material may be higher than dielectric constants of the silicon oxide and the silicon nitride. The second gate dielectric layer 331 may be a stacked layer where an interface layer and the high-k material are stacked. The interface layer may include a silicon oxide, a silicon nitride and a silicon oxynitride.

As described above, the semiconductor device 300 includes the first transistor 320 having the buried gate structure 305 and the second transistor 330 having the planar gate electrode 334 that are integrated in the substrate 301.

The first transistor 320 and the second transistor 330 in the semiconductor device 300 may be a NMOSFET.

The semiconductor device 300 may include a CMOSFET. For example, the first transistor 320 may be an NMOSFET, and the second transistor 330 may be a PMOSFET. To control an appropriate threshold voltage for the CMOSFET, the buried gate structure 305 may have an N-type work function, and the planar gate electrode 334 may have a P-type work function. The threshold voltage may be controlled to have the N-type work function or the P-type work function based on the carbon content of the first and second bulk tungsten electrodes 307 and 333.

The first transistor 320 is referred to as a buried gate-type transistor, and the second transistor 330 is referred to as a planar gate-type transistor. The planar gate-type transistor is an example of a non-buried gate-type transistor. The non-buried gate-type transistor may include a general fin-type transistor. The fin-type transistor is different from a buried gate-type fin channel transistor. The fin-type transistor outthrusts an active region and forms a fin region by recessing just an isolation region without forming a trench.

In the semiconductor 300, the first transistor 320 may be a transistor of memory cells, and the second transistor 330 may be a transistor of a peripheral circuit region.

Figure 15:
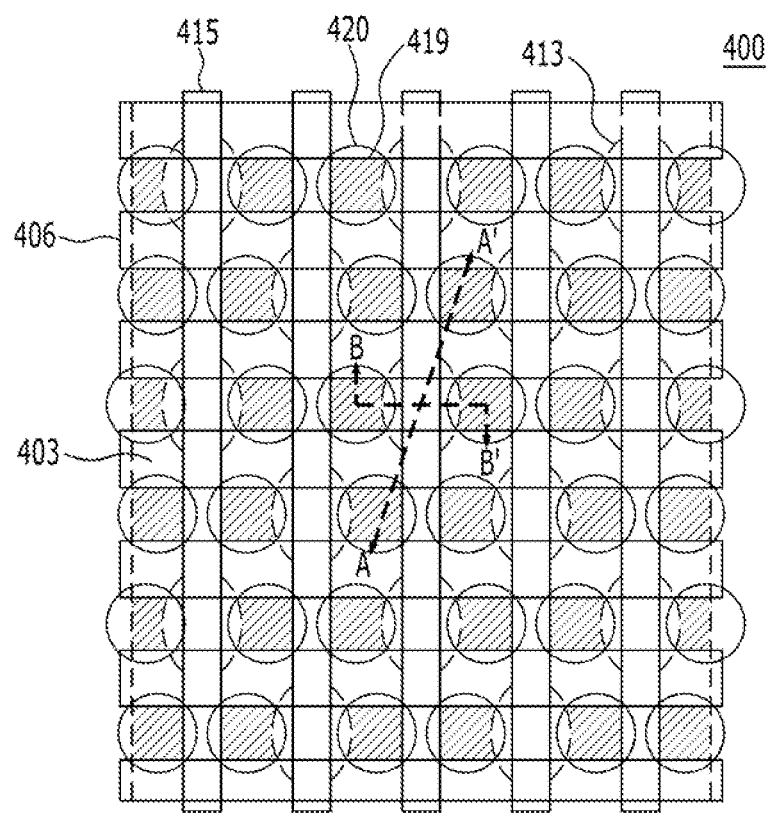
FIG. 15 exemplarily illustrates a semiconductor device in accordance with the embodiments of the present invention.
Figure 16A:
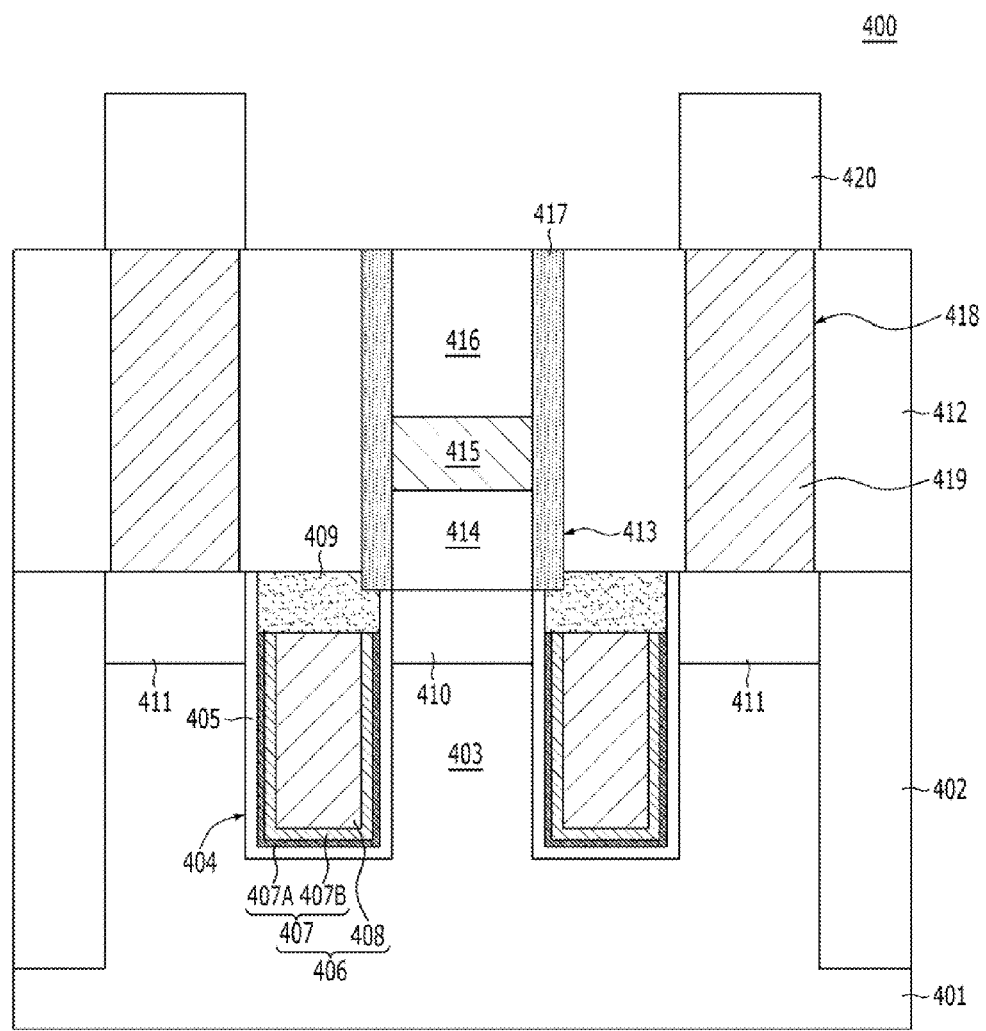
FIG. 16A is a cross-sectional view illustrating the semiconductor device taken along an A-A' line shown in FIG. 15.
Figure 16B:
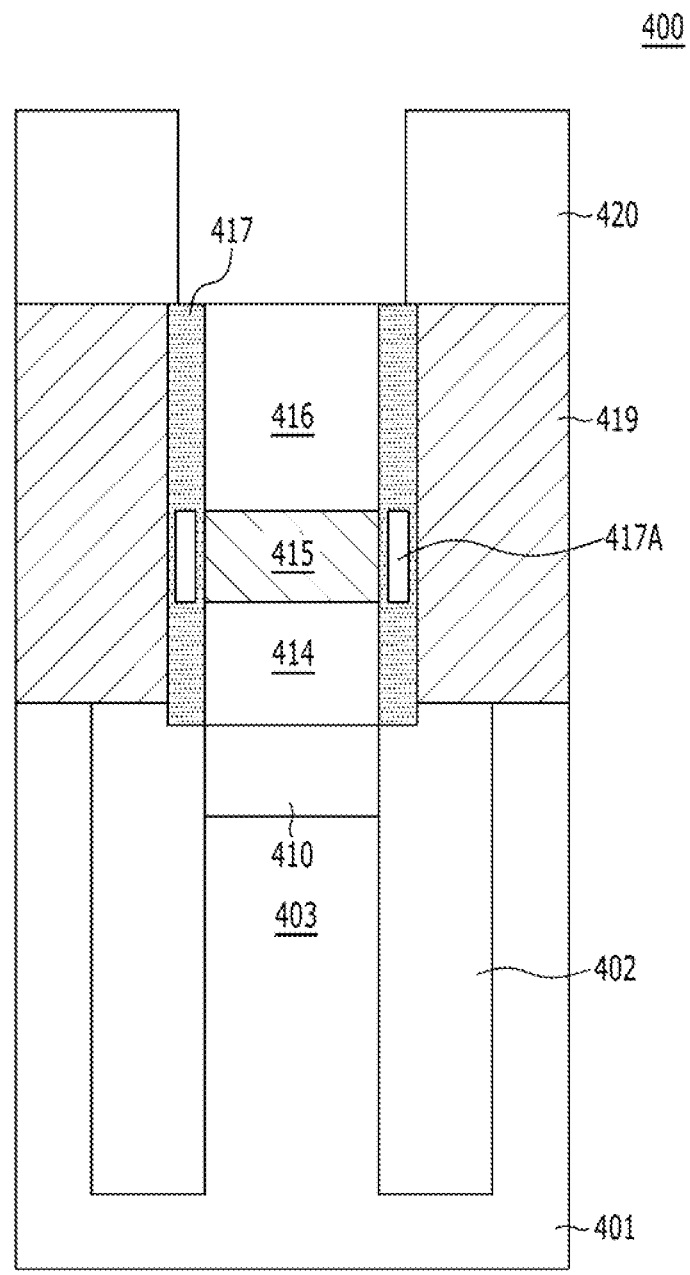
FIG. 16B is a cross-sectional view illustrating the semiconductor device taken along a B-B' line shown in FIG. 15.

FIG. 15 exemplarily illustrates the semiconductor device in accordance with the embodiments of the present invention. FIG. 15 is a plan view illustrating a memory cell array. FIG. 16A is a cross-sectional view illustrating the semiconductor device taken along an A-A' line shown in FIG. 15. FIG. 16B is a cross-sectional view illustrating the semiconductor device taken along a B-B' line shown in FIG. 15.

Referring to FIGS. 15, 16A and 16B, the memory cell array 400 includes a plurality of buried word lines 406, a plurality of bit lines 415 extended in a direction crossing with the buried word lines 406, and a plurality of memory elements 420.

The memory cell array 400 is described hereafter in detail.

An isolation region 402 is formed in a substrate 401. A plurality of active regions 403 are defined by the isolation region 402. A gate trench 404 crossing the active regions 403 is formed. A gate dielectric layer 405 is formed on the surface of the gate trench 404. The buried word line 406 is formed to partially bury the gate trench 404 over the gate dielectric layer 405. The buried word line 406 includes a fluorine-free tungsten barrier layer 407 and a bulk tungsten electrode 408. The fluorine-free tungsten barrier layer 407 is a bilayer of a first fluorine-free tungsten layer 407A and a second fluorine-free tungsten layer 407B. A capping layer 409 is formed over the bulk tungsten electrode 408. A fin region (not shown) may be formed below the buried word line 406. The buried word line 406 is the same as the buried gate structure which is described in the aforementioned embodiments of the present invention. A first impurity region 410 and a second impurity region 411 are formed in the substrate 401 on both sides of the buried word line 406.

A bit line structure which is electrically connected to the first impurity region 410 may be formed. The bit line structure includes the bit line 415 and a bit line hard mask layer 416. The bit line structure may further include a first contact plug 414 between the bit line 415 and the first impurity region 410. Spacers 417 are formed on the sidewalls of the bit line structure. An isolation layer 412 is formed over the substrate 401. A first contact plug 414 may be formed in a first contact hole 413. The first contact plug 414 is electrically connected to the first impurity region 410. The diameter of the first contact hole 413 may be smaller than the line width of the bit line 415. The line width of the first contact plug 414 may be the same as the line width of the bit line 415. Therefore, a gap exists between the first contact plug 414 and the sidewall of the first contact hole 413, and a portion of the spacer 417 is extended to be buried in the gap. The surface of the first impurity region 410 may be recessed, thus, the contact area between the first contact plug 414 and the first impurity region 410 is increased. The bit line 415 may have a shape of a line which is extended in a direction crossing a direction where the buried word line 406 is extended. The bit line 415 may include at least one among a poly-silicon, a metal silicide, a metal nitride, and a metal. The bit line hard mask layer 416 may include a silicon oxide or a silicon nitride. The first contact plug 414 may include at least one of a poly-silicon, a metal silicide, a metal nitride, and a metal. The spacer 417 includes an insulating material. The spacer 417 may include a silicon oxide, a silicon nitride or a combination of the silicon oxide and the silicon nitride. The spacer 417 may be of a multi-spacer structure. For example, the spacer 417 may have a structure of a silicon nitride-a silicon oxide-a silicon nitride (NON). The spacer 417 may have a multi-spacer structure in which an air gap 417A is embedded. The air gap 417A may be formed between the bit line 415 and a second contact plug 419. The spacer 417 may have an N-Air-N structure in which the air gap 417A is disposed between silicon nitrides. The air gap 417A may be disposed between the bit line 415 and the second contact plug 419. Also, the air gap 417A may be extended to be disposed between the first contact plug 414 and the second contact plug 419. Parasitic capacitance between the bit line 415 and the second contact plug 419 is reduced by the air gap 417A. The sensing margin may improve since the parasitic capacitance is reduced.

The memory element 420 may be formed over the second impurity region 411. The second contact plug 419 may be formed between the memory element 420 and the second impurity region 411. A second contact hole 418 may penetrate the isolation layer 412, and the second contact plug 419 may be formed in the second contact hole 418. The second contact plug 419 is electrically connected to the second impurity region 411. The second contact plug 419 may include at least one of a poly-silicon, a metal, a metal silicide, and a metal nitride. For example, the second contact plug 419 may include a poly-silicon, a metal silicide and a plug structure where metals are stacked. The isolation layer 412 may be of a single-layer or a multi-layer. The isolation layer 412 may include at least one of a silicon oxide, a silicon nitride, and a silicon oxynitride. The isolation layer 412 may be formed through a damascene process, etc. The isolation layer 412 serves to isolate the adjacent second contact plugs 419 from each other. In another embodiment of the present invention, contact spacers (not shown) may be further formed to surround the sidewalls of the second contact plug 419. Each contact spacer may be of a multi-spacer structure in which an air gap is embedded, and the air gap may not be formed in the spacer 417. The upper surface of the isolation layer 412 may be disposed on the same level as the upper surface of the bit line structure. In another embodiment of the present invention, a third contact plug (not shown) may be further formed over the second contact plug 419. The third contact plug may have a shape which overlaps each bit line structure and the second contact plug 419. The third contact plug may include a metal material.

The memory element 420 which is electrically connected to the second contact plug 419 may be formed over the second contact plug 419. The memory element 420 may be formed in various shapes.

The memory element 420 may be a capacitor. Therefore, the memory element 420 may include a storage node which contacts the second contact plug 419. The storage node may have the shape of a cylinder or a pillar. A capacitor dielectric layer may be formed on the surface of the storage node. The capacitor dielectric layer may include at least one of a zirconium oxide, an aluminum oxide, and a hafnium oxide. For example, the capacitor dielectric layer may have a ZAZ structure where a first zirconium oxide, an aluminum oxide and a second zirconium oxide are stacked. A plate node is formed over the capacitor dielectric layer. The storage node and the plate node may include metal-containing materials.

The memory element 420 may include a variable resistor. The variable resistor may include a phase-change material. The variable resistor may include a transition metal oxide. In another embodiment of the present invention, the variable resistor may be a magnetic tunnel junction (MTJ).

Since the buried word line 406 includes the fluorine-free tungsten barrier layer 407 and the bulk tungsten electrode 408, word line resistance may be reduced.

Consequently, high-speed operation of the memory cell array may be realized.

The transistors in accordance with the embodiments of the present invention may be integrated into transistor circuits. Also, the transistors in accordance with the embodiments of the present invention may be applied to integrated circuits including transistors for serving various purposes, e.g., an insulated gate FET (IGFET), a high electron mobility transistor (HEMT), a power transistor, a thin film transistor (TFT), etc.

The transistors and the integrated circuits in accordance with the embodiments of the present invention may be embedded in an electronic device. The electronic device may include a memory device and a non-memory device. The memory device includes an SRAM, a DRAM, a flash memory, a MRAM, a ReRAM, a STTRAM, a FeRAM, etc. The non-memory device includes a logic circuit. For controlling the memory device, the logic circuit may include a sense amplifier, a decoder, an input/output circuit, etc. Additionally, the logic circuit may include a variety of integrated circuits other than the memory. For example, the logic circuit includes a microprocessor, an application processor (AP) of a mobile device, etc. Furthermore, the non-memory device includes a logic gate such as a NAND gate, a driver integrated circuit for a display device, a power semiconductor device such as a power management integrated circuit (PMIC), etc. The electronic device may include a computing system, an image sensor, a camera, a mobile device, a display device, a sensor, a medical device, photoelectronic device, a radio frequency identification (RFID), a solar battery, an automobile semiconductor device, a rolling stock semiconductor device, an aircraft semiconductor device, etc.

Hereafter, diverse examples in which the transistors in accordance with the embodiments of the present invention are applied are described.

Figure 17A:
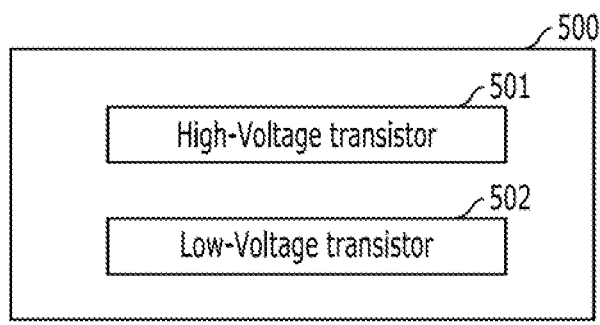
FIGS. 17A to 17C exemplarily illustrate integrated circuits including the transistors in accordance with the embodiments of the present invention.
Figure 17B:
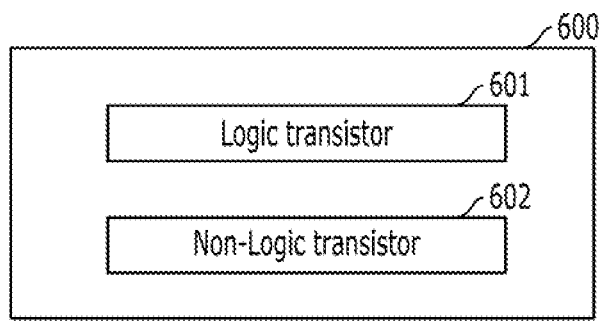
Figure 17C:
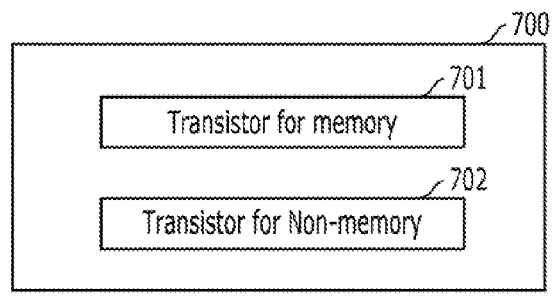

FIGS. 17A to 17C exemplarily illustrate integrated circuits including the transistors in accordance with the embodiments of the present invention.

An integrated circuit 500 shown in FIG. 17A includes a plurality of high-voltage transistors 501 and a plurality of low-voltage transistors 502.

An integrated circuit 600 shown in FIG. 17B includes a plurality of logic transistors 601 and a plurality of non-logic transistors 602.

An integrated circuit 700 shown in FIG. 17C includes a transistor for a memory device 701 and a transistor for a non-memory device 702.

The high-voltage transistors 501, the low-voltage transistors 502, the logic transistors 601, the non-logic transistors 602, the transistor for the memory device 701, and the transistor for the non-memory device 702 may include the buried gate-type transistors in accordance with the embodiments of the present invention. The buried gate-type transistors included in the integrated circuits 500, 600 and 700 include buried gate structures formed in trenches. The buried gate structures include fluorine-free tungsten barrier layers and bulk tungsten electrodes. The fluorine-free tungsten barrier layers may be bilayers of first fluorine-free tungsten layers and second fluorine-free tungsten layers.

As a result, the performance of the integrated circuits 500, 600 and 700 may improve.

Figure 18:
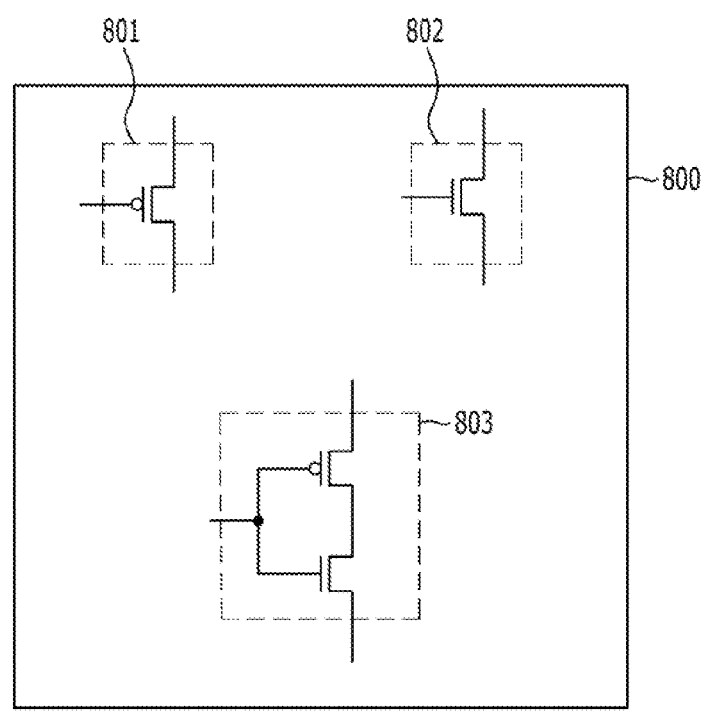
FIG. 18 illustrates an electronic device including the transistors in accordance with the embodiments of the present invention.

FIG. 18 illustrates an electronic device including the transistors in accordance with the embodiments of the present invention.

Referring to FIG. 18, the electronic device 800 includes a plurality of transistors. The electronic device 800 may include a plurality of PMOSFETs 801, a plurality of NMOSFETs 802 and a plurality of CMOSFETs 803. At least one among the PMOSFET 801, NMOSFET 802 and CMOSFET 803 may include the buried gate-type transistors in accordance with the embodiments of the present invention. The buried gate-type transistors included in the electronic device 800 include buried gate structures formed in trenches. The buried gate structures include fluorine-free tungsten barrier layers and bulk tungsten electrodes. The fluorine-free tungsten barrier layers may be bilayers of first fluorine-free tungsten layers and second fluorine-free tungsten layers.

Therefore, the electronic device 800 may have a high-speed operation rate corresponding to its miniaturization.

In accordance with the embodiments of the present invention, a low resistance buried gate structure may be formed as a fluorine-free tungsten barrier layer and a bulk tungsten layer.

In accordance with the embodiments of the present invention, a gate dielectric layer may be protected from attack by fluorine as the fluorine-free tungsten barrier layer is formed.

In accordance with the embodiments of the present invention, plasma damage of the gate dielectric layer may be prevented by a first fluorine-free tungsten barrier layer formed with low-power high-frequency plasma, and a barrier layer having sufficient thickness may be formed as a second fluorine-free tungsten barrier layer with high-power high-frequency plasma.

In accordance with the embodiments of the present invention, the interface stability between the gate dielectric layer and the buried gate structure may improve when a plasma nitridation process of the gate dielectric layer, a pre-treatment before the deposition of the fluorine-free tungsten barrier layer and a post-treatment after the deposition of the fluorine-free tungsten barrier layer are performed.

While the present invention has been described with respect to the specific embodiments, it should be noted that the embodiments are for describing, not limiting, the present invention. Further, it should be noted that the present invention may be achieved in various ways through substitution, change and modification, by those skilled in the art without departing from the scope of the present invention as defined by the following claims.

What is claimed is:

1. A method for fabricating a transistor, comprising:
forming a trench in a substrate;
forming a gate dielectric layer on a surface of the trench;
forming a first fluorine-free tungsten layer as an interface stabilization layer over the gate dielectric layer;
forming a second fluorine-free tungsten layer as a barrier layer over the first fluorine-free tungsten layer;
forming a third tungsten layer as a gate electrode over the second fluorine-free tungsten layer to fill the trench; and
selectively recessing the third tungsten layer, the second fluorine-free tungsten layer and the first fluorine-free tungsten layer to form a buried gate structure,
wherein the forming of the second fluorine-free tungsten layer is performed by applying a second high-frequency plasma power, and the forming of the first fluorine-free tungsten layer is performed by applying a first high-frequency plasma power, which is less than the second high-frequency plasma power.

2. The method of claim 1, wherein the forming of the first fluorine-free tungsten layer and the forming of the second fluorine-free tungsten layer are performed in situ in an atomic layer deposition chamber.

3. The method of claim 1, wherein the forming of the first fluorine-free tungsten layer and the forming of the second fluorine-free tungsten layer each include depositing a fluorine-free tungsten layer in a reaction between a fluorine-free tungsten compound and hydrogen plasma.

4. The method of claim 3, wherein the forming of the first fluorine-free tungsten layer is performed by adding argon plasma to the hydrogen plasma.

5. The method of claim 1, wherein the first fluorine-free tungsten layer and the second fluorine-free tungsten layer are formed through an atomic layer deposition process, and the third tungsten layer is formed through a chemical vapor deposition process.

6. The method of claim 1, further comprising, before the forming of the trench:
forming an isolation region, which defines an active region in the substrate; and
recessing the isolation region below the trench to form a fin region.

7. A method for fabricating a transistor, comprising:
forming a trench in a substrate;
forming a gate dielectric layer on a surface of the trench;
performing a plasma nitridation process on the gate dielectric layer;
forming a first fluorine-free tungsten layer over the gate dielectric layer through a pre-treatment;
forming a second fluorine-free tungsten layer over the first fluorine-free tungsten layer;
performing a post-treatment of the first and second fluorine-free tungsten layers;
forming a third tungsten layer over the second fluorine-free tungsten layer to fill the trench;
annealing the third tungsten layer; and
selectively recessing the third tungsten layer, the second fluorine-free tungsten layer and the first fluorine-free tungsten layer to form a buried gate structure.

8. The method of claim 7, wherein the forming of the first fluorine-free tungsten layer and the forming of the second fluorine-free tungsten layer are performed in situ in an atomic layer deposition chamber.

9. The method of claim 8, wherein the pre-treatment is performed by applying plasma having a high-frequency plasma power less than the plasma of the post-treatment, and the forming of the second fluorine-free tungsten layer is performed by applying plasma having a high-frequency plasma power greater than the plasma of the post-treatment.

10. The method of claim 7, wherein the forming of the second fluorine-free tungsten layer is performed by applying a second high-frequency plasma power, and the forming of the first fluorine-free tungsten layer is performed by applying a first high-frequency plasma power which is less than the second high-frequency plasma power.

11. The method of claim 7, wherein the forming of the first fluorine-free tungsten layer and the forming of the second fluorine-free tungsten layer each include depositing a fluorine-free tungsten layer in a reaction between a fluorine-free tungsten compound and hydrogen plasma in an atomic deposition chamber.

12. The method of claim 11, wherein the forming of the first fluorine-free tungsten layer is performed by adding argon plasma to the hydrogen plasma.

13. The method of claim 7, wherein the first fluorine-free tungsten layer and the second fluorine-free tungsten layer are formed through an atomic layer deposition process, and the third tungsten layer is formed through a chemical vapor deposition process.

14. The method of claim 7, wherein the pre-treatment is performed in a reaction between a fluorine-free tungsten compound and a combined plasma of hydrogen plasma and argon plasma.

15. The method of claim 7, wherein the post-treatment includes a plasma treatment using a combined plasma of hydrogen plasma and nitride plasma.

16. The method of claim 7, further comprising, before the forming of the trench:
forming an isolation region, which defines an active region in the substrate; and
recessing the isolation region below the trench to form a fin region.

* * * * *